(12) United States Patent
Hasebe et al.

(10) Patent No.: US 7,407,823 B2
(45) Date of Patent: Aug. 5, 2008

(54) MANUFACTURING METHOD OF SEMICONDUCTOR INTEGRATED CIRCUIT DEVICE

(75) Inventors: Akio Hasebe, Tokyo (JP); Masayoshi Okamoto, Tokyo (JP); Yasunori Narizuka, Tokyo (JP); Shingo Yorisaki, Tokyo (JP); Yasuhiro Motoyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 230 days.

(21) Appl. No.: 11/471,712

(22) Filed: Jun. 21, 2006

(65) Prior Publication Data

US 2006/0286715 A1 Dec. 21, 2006

(30) Foreign Application Priority Data

Jun. 21, 2005 (JP) ............................. 2005-181085

(51) Int. Cl.
H01L 21/66 (2006.01)
(52) U.S. Cl. ....................................................... 438/17
(58) Field of Classification Search ............. 438/14–18, 438/75, 107–109, 200, 113, 101–102, 180, 438/635, 687, 612, 53, 396, 455
See application file for complete search history.

(56) References Cited

U.S. PATENT DOCUMENTS 6,305,230 B1  10/2001  Kasukabe et al.

| 2002/0155661 | A1 * | 10/2002 | Massingill et al. ........... 438/244 |
| 2006/0286715 | A1 * | 12/2006 | Hasebe et al. ................ 438/107 |
| 2007/0037321 | A1 * | 2/2007  | Higashino et al. ............ 438/109 |

FOREIGN PATENT DOCUMENTS

| JP | 07-283280   | 10/1995 |
| JP | 08-050146   | 2/1996  |
| JP | 08-201427   | 8/1996  |
| JP | 10-308423   | 11/1998 |
| JP | 11-023615   | 1/1999  |
| JP | 11-097471   | 4/1999  |
| JP | 2000-150594 | 5/2000  |
| JP | 2001-159643 | 6/2001  |

* cited by examiner

Primary Examiner—Michael S. Lebentritt
Assistant Examiner—Andre' Stevenson
(74) Attorney, Agent, or Firm—Antonelli, Terry, Stout & Kraus, LLP.

(57) ABSTRACT

During probe testing using a prober having probe needles formed by using a manufacturing technology for a semiconductor integrated circuit device, reliable contact is ensured between the probe needles and test pads. A pressing tool having at least one hole portion formed therein and extending therethrough between the main and back surface thereof is prepared. An elastomer in the form of a sheet and a polyimide sheet are successively disposed on the main surface of the pressing tool. With th elastomer and the polyimide sheet being electrostatically attracted to the pressing tool, the pressing tool is disposed on a thin-film sheet such that the main surface thereof faces the back surface (the surface opposite to the main surface thereof formed with the probe) of the thin-film sheet. Then, the thin-film sheet with the pressing tool bonded thereto is attached to a probe card.

26 Claims, 30 Drawing Sheets

MANUFACTURING METHOD OF SEMICONDUCTOR INTEGRATED CIRCUIT DEVICE

CROSS-REFERENCE TO RELATED APPLICATION

The present application claims priority from Japanese patent application No. 2005-181085 filed on Jun. 21, 2005, the content of which is hereby incorporated by reference into this application.

BACKGROUND OF THE INVENTION

The present invention relates to a manufacturing technology for a semiconductor integrated circuit device and, more particularly, to a technology which is useful when applied to electrical testing of a semiconductor integrated circuit performed by pressing the probe needles of a probe card against the electrode pads of a semiconductor integrated circuit device.

A structure of a prober having probe needles (contact terminals) formed by using a manufacturing technology for a semiconductor integrated circuit device, an insulating film, and wires for extraction, a manufacturing method thereof, and a technology which allows probe testing to be implemented by using the prober even with respect to chips having test pads arranged with a narrower pitch are disclosed in each of Japanese Unexamined Patent Publication No. Hei 7(1995)-283280 (Patent Document 1), Japanese Unexamined Patent Publication No. Hei 8(1996)-50146 (Patent Document 2 (corresponding to PCT International Publication No. WO 95/34000)), Japanese Unexamined Patent Publication No. Hei 8(1996)-201427 (Patent Document 3), Japanese Unexamined Patent Publication No. Hei 10(1998)-308423 (Patent Document 4), Japanese Unexamined Patent Publication No. Hei 11(1999)-23615 (Patent Document 5 (corresponding to U.S. Pat. No. 6,305,230)), Japanese Unexamined Patent Publication No. Hei 11(1999)-97471 (Patent Document 6 (corresponding to European Patent Publication No. EP 1022775)), Japanese Unexamined Patent Publication No. 2000-150594 (Patent Document 7 (corresponding to European Patent Publication No. EP 0999451)), and Japanese Unexamined Patent Publication No. 2001-159643 (Patent Document 8).

[Patent Document 1] Japanese Unexamined Patent Publication No. Hei 7(1995)-283280

[Patent Document 2] Japanese Unexamined Patent Publication No. Hei 8(1996)-50146

[Patent Document 3] Japanese Unexamined Patent Publication No. Hei 8(1996)-201427

[Patent Document 4] Japanese Unexamined Patent Publication No. Hei 10(1998)-308423

[Patent Document 5] Japanese Unexamined Patent Publication No. Hei 11(1999)-23615

[Patent Document 6] Japanese Unexamined Patent Publication No. Hei 11(1999)-97471

[Patent Document 7] Japanese Unexamined Patent Publication No. 2000-150594

[Patent Document 8] Japanese Unexamined Patent Publication No. 2001-159643

SUMMARY OF THE INVENTION

As a technology for testing semiconductor integrated circuit devices, there has been probe testing. The probe testing includes a functional test for checking whether or not each of the semiconductor integrated circuit devices operates to perform prescribed functions, a test for determining good/defective items by testing the DC and AC operating characteristics thereof, and the like. To satisfy such requirements as an ability to support wafer shipment (product quality differentiation), an ability to support a KDG (Known Good Die) (an improvement in the yield of a MCP (Multi-Chip Package)), and a reduction in total cost, a technology which allows the probe testing of semiconductor integrated circuit devices in the wafer state has been used.

In recent years, the development of a semiconductor integrated circuit device with multiple functions has been promoted and the incorporation of a plurality of circuits in a single semiconductor chip (hereinafter simply referred to as a chip) has been pursued. To reduce manufacturing cost for semiconductor integrated circuit devices, the miniaturization of semiconductor elements and wires has also been promoted so that the area of a semiconductor chip (hereinafter simply referred to as a chip) is reduced and the number of chips obtained from one semiconductor wafer (hereinafter simply referred to as a wafer) is increased. As a result, not only the number of test pads (bonding pads) has increased but also the pitch of the arranged test pads has been becoming narrower so that the area of each of the test pads has also been reduced. As the pitch of the test pads has thus been becoming narrower, a problem occurs such that, when a prober having cantilever probe needles is to be used for the probe testing described above, the placement of the probe needles in registration with the positions of the arranged test pads becomes difficult.

The present inventors have studied a technology which allows probe testing to be performed even with respect to chips having test pads arranged with a narrower pitch by using a prober having probe needles formed by using a manufacturing technology for a semiconductor integrated circuit device. In the study, the present inventors have encountered the following problem.

That is, each of the probe needles mentioned above is a part of a thin-film probe formed by performing the deposition of a metal film and a polyimide film and the patterning thereof using the manufacturing technology for a semiconductor integrated circuit device and provided on the main surface of the thin-film probe opposing chips as testing targets. During probe testing, the region of the thin-film probe which is formed with the probe needles is pressed from the back surface thereof opposite to the main surface by using a pressing tool made of, e.g., 42 alloy or the like and having a flat pressing surface. At this time, when there are differences between the respective heights of the tips of all the probe needles and between the respective heights of the corresponding test pads, the problem may occur that any of the probe needles is kept from contacting the corresponding test pad. To solve the problem, it is required to ensure reliable contact between each of the probe needles and the corresponding test pad during probe testing.

An object of a representative aspect of the invention disclosed in the present application is to provide a technology which ensures, during probe testing using a prober having probe needles formed by using a manufacturing technology for a semiconductor integrated circuit device, reliable contact between the probe needles and test pads.

A brief description will be given to the outline of the representative aspects of the invention disclosed in the present application.

The first aspect of the present invention is a manufacturing method of a semiconductor integrated circuit device comprising the following steps of: (a) preparing a semiconductor wafer partitioned into a plurality of chip regions in which individual semiconductor integrated circuits are formed, the semiconductor wafer having a plurality of first electrodes formed over a main surface thereof and electrically connected to the semiconductor integrated circuits; (b) preparing a first card comprising: a first wiring board which has first wires formed therein; a first sheet which has a plurality of contact terminals formed thereover for contact with the first electrodes and has a plurality of second wires formed therein and electrically connected to the contact terminals and to the first wires, the first sheet being held by the first wiring board such that the contact terminals have respective tips thereof opposing the main surface of the semiconductor wafer; and a pressing mechanism which has a first main surface opposing the first sheet, has a first back surface opposite to the first main surface, and has at least one first hole portion formed therein and extending therethrough from the first main surface to the first back surface, the pressing mechanism pressing from a back surface side thereof a first region of the first sheet which is formed with the contact terminals; and (c) performing electrical testing of the semiconductor integrated circuits by contacting the tips of the contact terminals with the first electrodes.

The second aspect of the present invention is a manufacturing method of a semiconductor integrated circuit device comprising the following steps of: (a) preparing a semiconductor wafer partitioned into a plurality of chip regions in which individual semiconductor integrated circuits are formed, the semiconductor wafer having a plurality of first electrodes formed over a main surface thereof and electrically connected to the semiconductor integrated circuits; (b) preparing a first card comprising: a first wiring board which has first wires formed therein; a first sheet which has a plurality of contact terminals formed thereover for contact with the first electrodes and has a plurality of second wires formed therein and electrically connected to the contact terminals and to the first wires, the first sheet being held by the first wiring board such that the contact terminals have respective tips thereof opposing the main surface of the semiconductor wafer; and a pressing mechanism which has a first main surface opposing the first sheet and including a first outer peripheral portion processed to prevent concentration of a stress on the first outer peripheral portion and has a first back surface opposite to the first main surface, the pressing mechanism pressing, from a back surface side thereof, a first region of the first sheet which is formed with the contact terminals; and (c) performing electrical testing of the semiconductor integrated circuits by contacting the tips of the contact terminals with the first electrodes.

In the manufacturing method described above, gas bubbles between the first sheet and the pressing mechanism are removed from the outer peripheral portion of the first main surface of the pressing mechanism.

The third aspect of the present invention is a manufacturing method of a semiconductor integrated circuit device comprising the following steps of: (a) preparing a semiconductor wafer partitioned into a plurality of chip regions in which individual semiconductor integrated circuits are formed, the semiconductor wafer having a plurality of first electrodes formed over a main surface thereof and electrically connected to the semiconductor integrated circuits; (b) preparing a first card comprising: a first wiring board which has first wires formed therein; a first sheet which has a plurality of contact terminals formed thereover for contact with the first electrodes and has a plurality of second wires formed therein and electrically connected to the contact terminals and to the first wires, the first sheet being held by the first wiring board such that the contact terminals have respective tips thereof opposing the main surface of the semiconductor wafer; and a pressing mechanism which has a first main surface opposing the first sheet and has a first back surface opposite to the first main surface, the pressing mechanism pressing, from a back surface side thereof, a first region of the first sheet which is formed with the contact terminals; and (c) performing electrical testing of the semiconductor integrated circuits by contacting the tips of the contact terminals with the first electrodes.

In the manufacturing method described above, the second wires are provided with equal coarseness or denseness in a vicinity of the contact terminals in the first sheet.

The fourth aspect of the present invention is a manufacturing method of a semiconductor integrated circuit device comprising the following steps of: (a) preparing a semiconductor wafer partitioned into a plurality of chip regions in which individual semiconductor integrated circuits are formed, the semiconductor wafer having a plurality of first electrodes formed over a main surface thereof and electrically connected to the semiconductor integrated circuits; (b) preparing a first card comprising: a first wiring board which has first wires formed therein; a first sheet which has a plurality of contact terminals formed thereover for contact with the first electrodes and has a plurality of second wires formed therein and electrically connected to the contact terminals and to the first wires; and a pressing mechanism which has a first main surface opposing the first sheet and has a first back surface opposite to the first main surface, the first sheet being held by the first wiring board such that the contact terminals have respective tips thereof opposing the main surface of the semiconductor wafer, the pressing mechanism pressing a first region of the first sheet which is formed with the contact terminals from a back surface side thereof; and (c) performing electrical testing of the semiconductor integrated circuits by contacting the tips of the contact terminals with the first electrodes.

In the manufacturing method described above, the second wires extracted from the contact terminals extend toward the outside of the first region in plan view and are placed in one layer in a vicinity of the contact terminals.

The fifth aspect of the present invention is a manufacturing method of a semiconductor integrated circuit device comprising the following steps of: (a) preparing a semiconductor wafer partitioned into a plurality of chip regions in which individual semiconductor integrated circuits are formed, the semiconductor wafer having a plurality of first electrodes formed over a main surface thereof and electrically connected to the semiconductor integrated circuits; (b) preparing a first card comprising: a first wiring board which has first wires formed therein; a first sheet which has a plurality of contact terminals formed over a second main surface for contact with the first electrodes, has a plurality of second wires formed therein and electrically connected to the contact terminals and to the first wires, has a second sheet having substantially the same linear expansion coefficient as the semiconductor wafer and bonded to a second back surface opposite to the second main surface formed with the contact terminals, and has an elastic member disposed to fill in an opening provided in the second sheet; and a pressing mechanism which has a first main surface opposing the first sheet and has a first back surface opposite to the first main surface, the first sheet being held by the first wiring board such that the contact terminals have respective tips thereof opposing the main surface of the semiconductor wafer, the pressing mechanism pressing, from a back surface side thereof, a first region of the first sheet which is formed with the contact terminals; and (c) performing electrical testing of the semiconductor integrated circuits by contacting the tips of the contact terminals with the first electrodes.

In the manufacturing method described above, the elastic member is disposed at a position which prevents deformation of the first sheet resulting from a temperature change.

The following is a brief description given to the outline of other inventive aspects disclosed in the present application.

One inventive aspect disclosed in the present application is a probe card comprising: a first wiring board which has first wires formed therein; a first sheet which has a plurality of contact terminals formed thereover for contact with a plurality of first electrodes formed over a main surface of a wafer and has a plurality of second wires formed therein and electrically connected to the contact terminals and to the first wires; and a pressing mechanism which has a first main surface opposing the first sheet, has a first back surface opposite to the first main surface, and has at least one first hole portion formed therein and extending therethrough from the first main surface to the first back surface, wherein the first sheet is held by the first wiring board such that the contact terminals have respective tips opposing the main surface of the semiconductor wafer and the pressing mechanism presses a first region of the first sheet which is formed with the contact terminals from a back surface side thereof.

In the probe card described above, impact reducing means for accommodating height differences between the respective tips of the contact terminals and accommodating height differences between respective surfaces of the first electrodes is disposed between the first sheet and the pressing mechanism.

In the probe card described above, the first main surface of the pressing mechanism includes a first outer peripheral portion processed to prevent concentration of a stress on the first outer peripheral portion, gas bubbles between the impact reducing means and the pressing means are removed from at least one of a second outer peripheral portion of a first contact surface between the impact reducing means and the pressing means and the first hole portion, and gas bubbles between the first sheet and the impact reducing means are removed from a third outer peripheral portion of a second contact surface between the first sheet and the impact reducing means.

In the probe card described above, the impact reducing means has at least one second hole portion formed therein and extending therethrough between main and back surfaces thereof and the gas bubbles between the first sheet and the impact reducing means are removed from at least one of a path including the second hole portion and the third outer peripheral portion.

In the probe card described above, the second hole portion is preliminarily formed by punching before the probe card is assembled.

In the probe card described above, the second wires are formed in a layout which prevents local concentration of a stress on the first sheet.

In the probe card described above, the second wires are provided with equal coarseness or denseness in the first sheet.

In the probe card described above, the second wires have equal widths, equal numbers of layers, and equal spacings therebetween in the first sheet.

In the probe card described above, at least one third wire electrically unconnected to any of the contact terminals in the same wiring layer in which the second wires are provided is formed in the first sheet.

In the probe card described above, the first sheet has at least one third hole portion formed therein and extending through between main and back surfaces thereof and gas bubbles between the first sheet and the pressing mechanism are removed from at least either of the first hole portion and the third hole portion.

In the probe card described above, impact reducing means for accommodating height differences between the respective tips of the contact terminals and height differences between respective surfaces of the first electrodes is disposed between the first sheet and the pressing mechanism.

In the probe card described above, the impact reducing means has at least one second hole portion formed therein and extending therethrough between main and back surfaces thereof and the second hole portion is preliminarily formed by punching before the probe card is assembled.

In the probe card described above, the impact reducing means has at least one second hole portion formed therein and extending therethrough between main and back surfaces thereof and a step of forming the second hole portion includes the steps of: (a) bonding the first sheet and the impact reducing means to each other before assembling the probe card; and (b) after the step (a), simultaneously forming the second and third hole portions.

In the probe card described above, the second and third hole portions are formed by laser processing.

In the probe card described above, the probe card is assembled after the second and third hole portions are formed and the contact terminals have respective positions thereof adjusted after the probe card is assembled.

In the probe card described above, the impact reducing means has at least one second hole portion formed therein and extending therethrough between main and back surfaces thereof, the first main surface of the pressing mechanism includes a first outer peripheral portion processed to prevent concentration of a stress on the outer peripheral portion, gas bubbles between the impact reducing means and the pressing mechanism are removed from a second outer peripheral portion of a first contact surface between the impact reducing means and the pressing mechanism, and gas bubbles between the first sheet and the impact reducing means are removed from a third outer peripheral portion of a second contact surface between the first sheet and the impact reducing means.

Another inventive aspect disclosed in the present application is a probe card comprising: a first wiring board which has first wires formed therein; a first sheet which has a plurality of contact terminals formed thereover for contact with a plurality of first electrodes formed over a main surface of a wafer and has a plurality of second wires formed therein and electrically connected to the contact terminals and to the first wires; and a pressing mechanism which has a first main surface opposing the first sheet and including a first outer peripheral portion processed to prevent concentration of a stress on the first outer peripheral portion and has a first back surface opposite to the first main surface, wherein the first sheet is held by the first wiring board such that the contact terminals have respective tips thereof opposing the main surface of the semiconductor wafer and the pressing mechanism presses a first region of the first sheet which is formed with the contact terminals from a back surface side thereof.

In the probe card described above, gas bubbles between the first sheet and the pressing mechanism are removed from the outer peripheral portion of the first main surface of the pressing mechanism.

Still another inventive aspect disclosed in the present application is a probe card comprising: a first wiring board which has first wires formed therein; a first sheet which has a plurality of contact terminals formed thereover for contact with a plurality of first electrodes formed over a main surface of a wafer and has a plurality of second wires formed therein and electrically connected to the contact terminals and to the first wires; and a pressing mechanism which has a first main surface opposing the first sheet and has a first back surface opposite to the first main surface, wherein the first sheet is held by the first wiring board such that the contact terminals have respective tips thereof opposing the main surface of the semiconductor wafer and the pressing mechanism presses a first region of the first sheet which is formed with the contact terminals from a back surface side thereof.

In the probe card described above, the second wires are provided with equal coarseness or denseness in a vicinity of the contact terminals in the first sheet.

In the probe card described above, the second wires have equal widths, equal numbers of layers, and equal spacings therebetween in the vicinity of the contact terminals in the first sheet.

In the probe card described above, at least one third wire electrically unconnected to any of the contact terminals in the same wiring layer in which the second wires are provided is formed in the vicinity of the contact terminals in the first sheet.

Yet another inventive aspect disclosed in the present application is a probe card comprising: a first wiring board which has first wires formed therein; a first sheet which has a plurality of contact terminals formed thereover for contact with a plurality of first electrodes formed over a main surface of a wafer and has a plurality of second wires formed therein and electrically connected to the contact terminals and to the first wires; and a pressing mechanism which has a first main surface opposing the first sheet and has a first back surface opposite to the first main surface, wherein the first sheet is held by the first wiring board such that the contact terminals have respective tips thereof opposing the main surface of the semiconductor wafer and the pressing mechanism presses a first region of the first sheet which is formed with the contact terminals from a back surface side thereof.

In the probe card described above, the second wires extracted from the contact terminals extend toward the outside of the first region in plan view and are placed in one layer in a vicinity of the contact terminals.

In the probe card described above, the semiconductor wafer is partitioned into a plurality of chip regions in which individual semiconductor integrated circuits are formed, the semiconductor wafer having the first electrodes disposed over a main surface thereof and electrically connected to the semiconductor integrated circuits, the contact terminals come in contact with the first electrodes disposed in two of the chip regions when the semiconductor integrated circuits are subjected to electrical testing, and the two chip regions have respective rectangular plan configurations and adjoin each other in a direction in which each of respective diagonals thereof extends.

Still another inventive aspect disclosed in the present application is a probe card comprising: a first wiring board which has first wires formed therein; a first sheet which has a plurality of contact terminals formed over a second main surface for contact with a plurality of first electrodes formed over a main surface of a wafer, has a plurality of second wires formed therein and electrically connected to the contact terminals and to the first wires, has a second sheet having substantially the same linear expansion coefficient as the semiconductor wafer and bonded to a second back surface opposite to the second main surface formed with the contact terminals, and has an elastic member disposed to fill in an opening provided in the second sheet; and a pressing mechanism which has a first main surface opposing the first sheet, has a first back surface opposite to the first main surface, and has at least one first hole portion formed therein and extending therethrough from the first main surface to the first back surface, wherein the first sheet is held by the first wiring board such that the contact terminals have respective tips opposing the main surface of the semiconductor wafer and the pressing mechanism presses a first region of the first sheet which is formed with the contact terminals from a back surface side thereof.

Here, the elastic member is arranged at a position which prevents deformation of the first sheet resulting from a temperature change.

In the probe card described above, the elastic member is disposed in the first region.

In the probe card described above, the elastic member is disposed at a center of the first region.

In the probe card described above, the first region has a rectangular plan configuration and a plurality of the elastic members are disposed at individual corner portions of the first region.

The following is the brief description of effects achievable by the representative aspects of the invention disclosed in the present application.

That is, during probe testing using a prober having probe needles formed by using a manufacturing technology for a semiconductor integrated circuit device, reliable contact is ensured between the probe needles and test pads.

DESCRIPTION OF THE PREFERRED EMBODIMENTS

Figure 1:
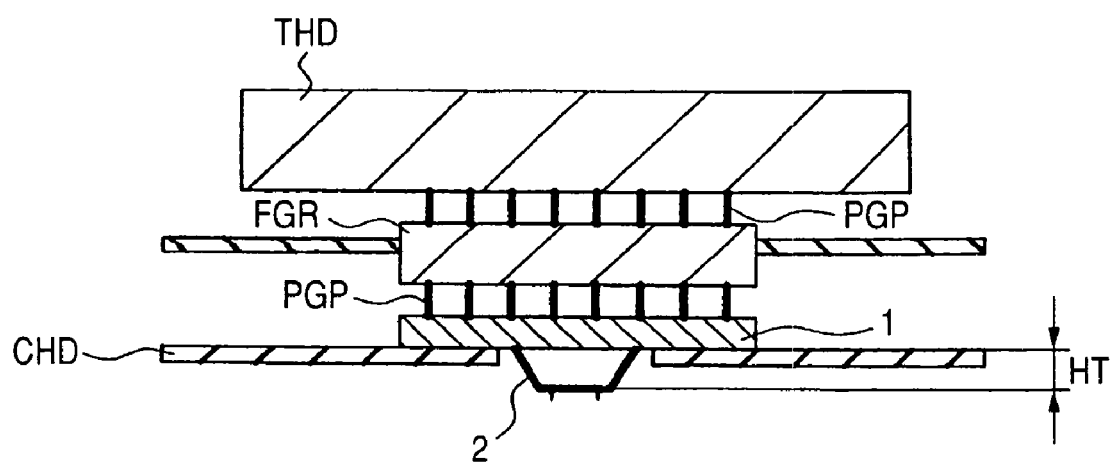
FIG. 1 is a main-portion cross-sectional view of a probe card according to a first embodiment of the present invention.

Before giving a detailed description to the invention of the present application, the meaning of the terminology used in the present application will be described as follows.

A wafer indicates a substrate used in the manufacturing of integrated circuits such as a monocrystalline silicon substrate (typically having a substantially circular plan configuration), a SOI (Silicon On Insulator) substrate, a sapphire substrate, a glass substrate, or another insulating, semi-insulating, or semiconductor substrate or a composite substrate thereof. In the present application, semiconductor integrated circuit devices include not only a device formed on a semiconductor substrate or an insulator substrate such as a silicon wafer, a sapphire substrate, or the like but also a device formed on another insulating substrate made of glass or the like, such as a TFT (Thin Film Transistor) or a STN (Super-Twisted-Nematic) liquid crystal device unless shown explicitly that this is not the case.

A device surface indicates a main surface of a wafer over which a device pattern corresponding to a plurality of chip regions is formed by lithography.

A contact terminal or probe indicates a wiring layer integrally formed with a tip portion electrically connected thereto by a wafer process, i.e., a patterning method which is a combination of a photolithographic technology, a CVD (Chemical Vapor Deposition) technology, a sputtering technology, an etching technology, and the like.

A thin-film probe (membrane probe), a thin-film probe card, or a projecting-needle wiring sheet composite indicates a thin film having a thickness of about 10 µm to 100 µm, the foregoing contact terminals (projecting needles) provided thereover for contact with testing targets, and wires routed therefrom and formed with electrodes for external contact.

A probe card indicates a structure having contact terminals for contact with a wafer as a testing target, a multilayer wiring board, and the like. A prober or a semiconductor testing apparatus indicates a testing apparatus having a sample support system including a frog ring and a wafer stage on which a probe card and a wafer as a testing target are placed.

Probe testing indicates electrical testing performed by using a prober with respect to a wafer after the completion of wafer steps. The electric testing is performed with respect to semiconductor integrated circuits by pressing the tips of the foregoing contact terminals against electrodes formed on the main surface of a chip region. The probe testing selectively determines good/defective items by performing a functional test for checking whether or not each of the semiconductor integrated circuit operates to perform prescribed functions and testing the DC and AC operating characteristics thereof. The probe testing is distinguished from a screening test (final test) performed after dividing the wafer into individual chips (or after the completion of packaging).

A POGO pin or spring probe indicates a contact needle having a structure which presses a contact pin (plunger (contact needle)) against an electrode (terminal) by using the elastic force of a spring (coil spring) and, as necessary, the contact needle is electrically connected to the electrode. The POGO pin is constituted such that the spring disposed in, e.g., a metal tube (holding member) transmits the elastic force to the contact pin via a metal ball.

A tester (Test System) performs electrical testing of each of semiconductor integrated circuits and generates a specified voltage and a signal serving as a reference, such as a timing signal.

A test head is electrically connected to the tester to receive the voltage and the signal transmitted from the tester, generate a voltage and a detailed signal such as a timing signal to each of the semiconductor integrated circuits, and send the signal to the probe card via the POGO pin or the like.

A frog ring is electrically connected to the tester head and to the probe card via the BOGO pins or the like to send the signal sent from the tester head to the probe card, which will be described later.

In the following embodiments, a description will be given to the present invention by dividing it, if necessary for the sake of convenience, into a plurality of sections or embodiments. However, they are by no means irrelevant to each other unless shown particularly explicitly and are mutually related to each other such that one of the sections or embodiments is a variation or a detailed or complementary description of some or all of the others.

If the number and the like of elements (including the number, numerical value, amount, and range thereof) are referred to in the following embodiments, they are not limited to specific numbers unless shown particularly explicitly or unless they are obviously limited to specific numbers in principle. The number and the like of the elements may be not less than or not more than specific numbers.

It will easily be appreciated that, in the following embodiments, the components thereof (including also elements and steps) are not necessarily indispensable unless shown particularly explicitly or unless the components are considered to be obviously indispensable in principle.

Likewise, if the configurations, positional relationship, and the like of the components are referred to in the following embodiments, the configurations and the like are assumed to include those substantially proximate or similar thereto unless shown particularly explicitly or unless obviously they are not in principle. The same shall apply to the foregoing numeric values and the range.

Throughout the drawings for illustrating the embodiments, parts having the same functions are designated by the same reference numerals and the repeated description thereof will be omitted.

Throughout the drawings for illustrating the embodiments, there are cases where even plan views are hatched for clarity of illustration of the constitution of each of members.

Since the processing of the thin film probe by using a semiconductor lithographic technology used in the present application has been disclosed in detail in the following patent applications made by the present inventors, inventors related thereto, and the like, the content thereof will not be repeated unless particularly necessary. The patent applications mentioned above are Japanese Patent Application No. Hei 6(1994)-22885, Japanese Unexamined Patent Publication No. Hei 7(1995)-283280, Japanese Unexamined Patent Publication No. Hei 8(1996)-50146, Japanese Unexamined Patent Publication No. Hei 8(1996)-201427, Japanese Patent Publication No. Hei 9(1997)-119107, Japanese Unexamined Patent Publication No. Hei 11(1999)-23615, Japanese Unexamined Patent Publication No. 2002-139554, Japanese Unexamined Patent Publication No. Hei 10(1998)-308423, Japanese Patent Application No. Hei 9(1997)-189660, Japanese Unexamined Patent Publication No. Hei 11(1999)-97471, Japanese Unexamined Patent Publication No. 2000-150594, Japanese Unexamined Patent Publication No. 2001-159643, Japanese Patent Application No. 2002-289377 (corresponding to U.S. application Ser. No. 10/676,609, filed Oct. 2, 2003), Japanese Unexamined Patent Publication No. 2004-132699, Japanese Unexamined Patent Publication No. 2005-24377, Japanese Unexamined Patent Publication No. 2004-288672 (corresponding to U.S. application Ser. No. 10/765, 917, filed Jan. 29, 2004), Japanese Unexamined Patent Publication No. 2004-144742 (corresponding to US Patent Publication No. 2004/070,413), Japanese Unexamined Patent Publication No. 2004-157127, Japanese Unexamined Patent Publication No. 2004-144742 (corresponding to US Application No. 2004/070,413), Japanese Unexamined Patent Publication No. 2004-157127, Japanese Patent Application No. 2003-371515 (corresponding to U.S. application Ser. No. 10/968,215, filed Oct. 20, 2004), Japanese Patent Application No. 2003-372323 (corresponding to U.S. application Ser. No. 10/968,431, filed Oct. 20, 2004), Japanese Patent Application No. 2004-115048, PCT Application No.

PCT/JP2004/17160, PCT Application No. PCT/JP2005/4344, Japanese Patent Application No. 2004-378504, Japanese Patent Application No. 2005-109350, and Japanese Patent Application No. 2005-168112.

Referring to the drawings, the embodiments of the present invention will be described herein below in detail.

Embodiment 1

FIG. 1 is a main-portion cross-sectional view of a probe card (first card) according to the first embodiment of the present invention. As shown in FIG. 1, the probe card according to the first embodiment is composed of such members as: a multilayer wiring board (first wiring board) 1; a thin-film sheet (first sheet) 2, a tester head THD; a frog ring FGR; and a card holder CHD. Electrical connection is provided via a plurality of POGO pins PGP between the tester head THD and the frog ring FGR and between the frog ring FGR and the multilayer wiring board 1 so that electrical connection is provided between the tester head THD and the multilayer wiring board 1. The card holder CHD mechanically connects the multilayer wiring board 1 to a prober and has a mechanical strength which prevents the multilayer wiring board 1 from warping under the pressure of the POGO pins PGP.

Figure 2:
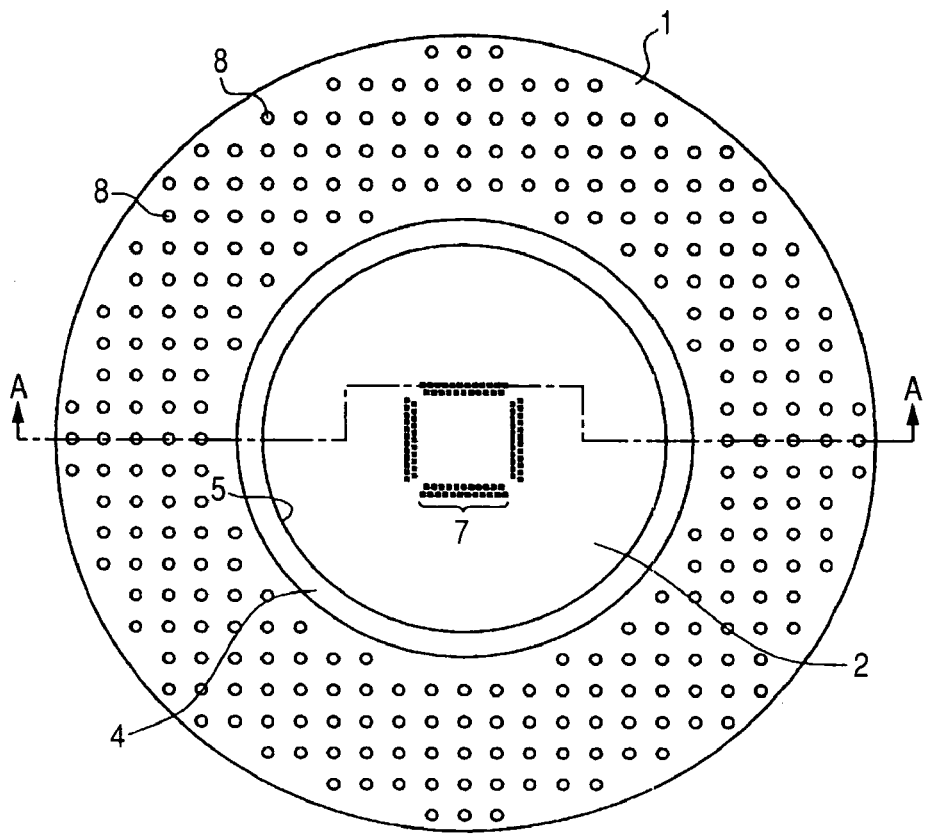
FIG. 2 is a main-portion plan view of the lower surface of the probe card according to the first embodiment.
Figure 3:
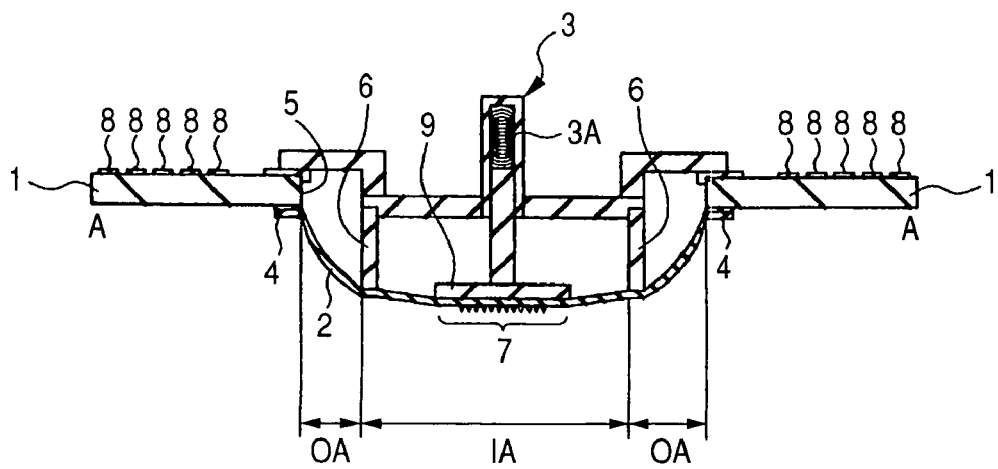
FIG. 3 is a cross-sectional view taken along the line A-A in FIG. 2.

FIG. 2 is a main-portion plan view of the lower surface of the probe card according to the present embodiment. FIG. 3 is a cross-sectional view taken along the line A-A in FIG. 2.

As shown in FIGS. 2 and 3, the probe card according to the present embodiment includes, e.g., a plunger 3 and the like in addition to the members shown in FIG. 1. The thin-film sheet 2 is fixed to the lower surface of the multilayer wiring board 1 by a pressing ring 4. The plunger 3 is attached to the upper surface of the multilayer wiring board 1. An opening 5 is provided in the center portion of the multilayer wiring board 1. In the opening 5, the thin-film sheet 2 and the plunger 3 are bonded to each other via a bonding ring 6.

A plurality of probes (connection terminals) 7 each configured as a quadrilateral pyramid or a truncated quadrilateral pyramid are formed on the lower surface of the thin-film sheet 2. In the thin-film sheet 2, a plurality of wires (second wires) electrically connected to the individual probes 7 and extending from the individual probes 7 to deeper portions in the thin-film sheet 2 are formed in the thin-film sheet 2. A plurality of receiving portions (not shown) for electrical contact with the respective end portions of the wires are formed on the lower or upper surface of the multilayer wiring board 1. The receiving portions are electrically connected to a plurality of POGO seats 8 provided on the upper surface of the multilayer wiring board 1 through wires (first wires) formed in the multilayer wiring board 1. Each of the POGO seats 8 has the function of receiving a pin for introducing a signal from a tester into the probe card.

In the first embodiment, the thin-film sheet 2 is composed of a thin film containing, e.g., polyimide as a main component. Since the thin-film sheet 2 has flexibility, the first embodiment has adopted the structure in which the plunger 3 presses the region (first region) of the thin-film sheet 2 which is formed with the probes 7 from the upper (back) surface thereof via a pressing tool (pressing mechanism) 9 to bring all the probes 7 into contact with the pads of chips (semiconductor integrated circuit devices). In short, a given pressure is applied to the pressing tool 9 under the elastic force of a spring 3A disposed in the plunger 3. In the present embodiment, 42 alloy can be shown as an example of the material of the pressing tool 9.

As the number of the test pads (bonding pads) formed on the surfaces of the chips as testing targets increases, the number of the POGO pins PGP for sending signals to the individual test pads increases accordingly. The increased number of the POGO pins PGP also increases the pressure applied from the POGO pins PGP to the multilayer wiring board 1 so that it becomes necessary to increase the thickness of the card holder CHD for the prevention of the warping of the multilayer wiring board 1. In the case of adopting the structure in which a tension is placed on each of the center area IA (see FIG. 3) of the thin-film sheet 2 and the outer peripheral area OA (see FIG. 3) thereof located circumferentially outside the bonding ring as a boundary and surrounding the center area IA to ensure the contact of each of the probes 7 formed on the thin-film sheet 2 with the corresponding test pad, the height HT (see FIG. 1) from the surface of the multilayer wiring board 1 to the probe surface of the thin-film sheet 2 is limited. When the thickness of the card holder CHD becomes larger than the limit value of the height HT, the thin-film sheet 2 is buried in the card holder CHD and the problem may occur that the probes 7 cannot reliably contact the test pads.

To prevent the problem, the first embodiment has adopted the structure in which the thin-film sheet 2 is bonded to the bonding ring 6 with the tension placed only on the center area IA of the thin-film sheet 2 without placing the tension on the outer peripheral area OA. At this time, a metal (e.g., 42 alloy) having substantially the same thermal expansion coefficient as Si (silicon) is selected as the material of the bonding ring 6 and, as an example of an adhesive agent for bonding the thin-film sheet 2 to the bonding ring 6, an epoxy-based adhesive agent can be used. This can increase the height of the bonding ring 6 which defines the height HT to the probe surface of the thin-film sheet 2 and also increases the height HT. As a result, the problem that the thin-film sheet 2 is buried in the card holder CHD can be circumvented. That is, even when the card holder CHD becomes thicker, it becomes possible to reliably contact the probes 7 with the test pads.

Figure 4:
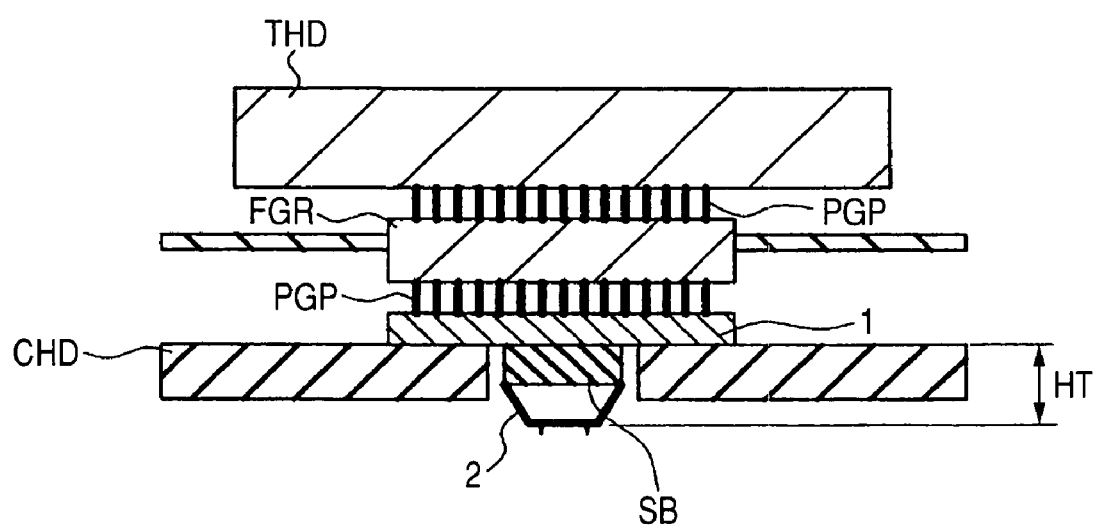
FIG. 4 is a main-portion cross-sectional view of the probe card according to the first embodiment.

Instead of using means as shown above, it is also possible to adopt the structure in which a supplemental board SB is attached to the center portion of the multilayer wiring board 1 and the thin-film sheet 2 is attached to the supplemental board SB and thereby increase the height HT from the surface of the multilayer wiring board 1 to the probe surface of the thin-film sheet 2, as shown in FIG. 4. In the same manner as in the multilayer wiring board 1, a plurality of wires are formed in the supplemental board SB and a plurality of receiving portions (not shown) for electrical contact with the respective end portions of these wires are further formed. The receiving portions provided in the multilayer wiring board 1 are electrically connected in corresponding relation to the receiving portions provided in the supplemental board SB by, e.g., soldering. Instead of soldering, means for compression bonding the supplemental board SB to the multilayer wiring board 1 via an anisotropic conductive rubber or means for forming projecting portions made of a Cu (copper) plate electrically connected to the foregoing receiving portions on the respective surfaces of the multilayer wiring board 1 and the supplemental board SB and compression bonding the corresponding ones of the projecting portions to each other may also be used.

Figure 5:
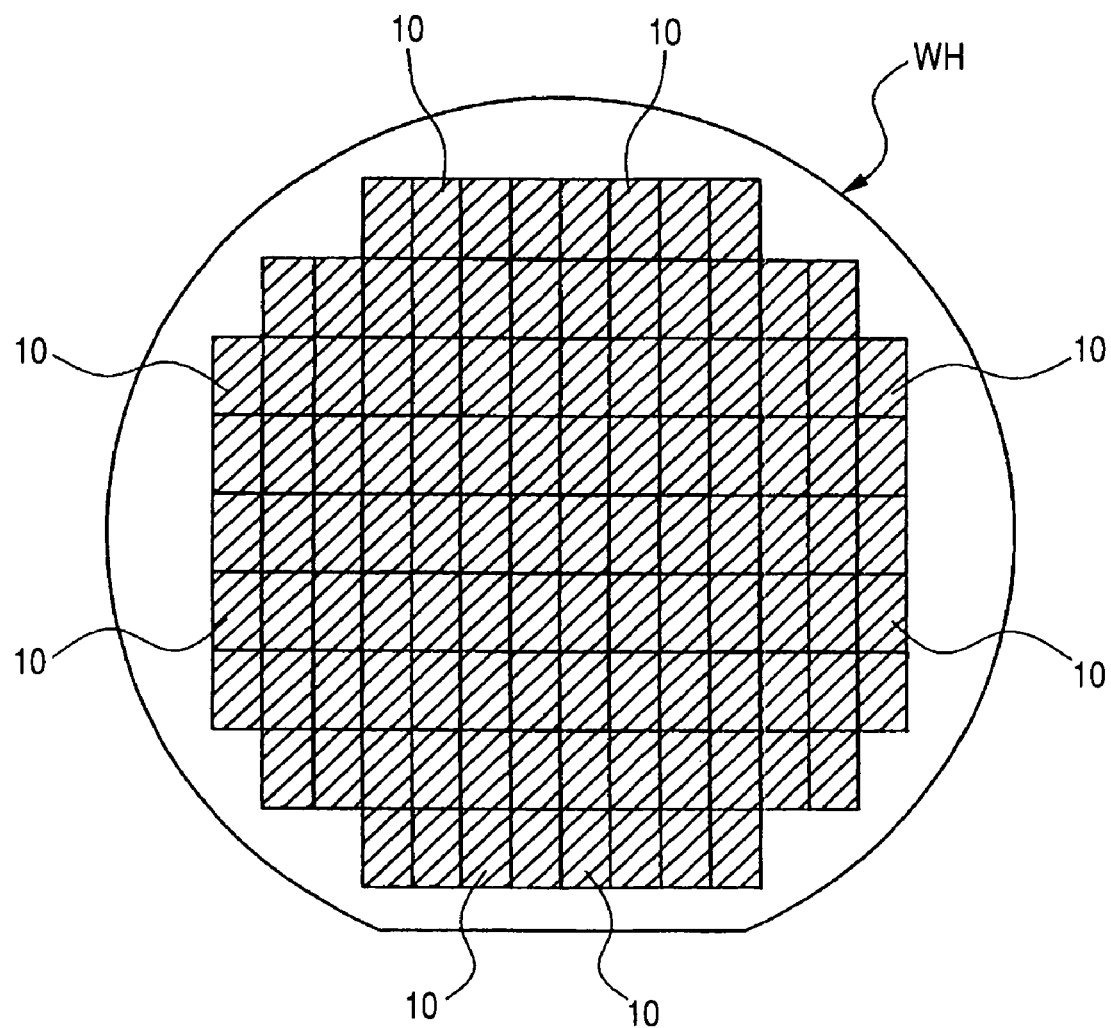
FIG. 5 is a plan view of a semiconductor wafer formed with semiconductor chip regions as a target of probe testing performed by using the probe card according to the first embodiment.
Figure 6:
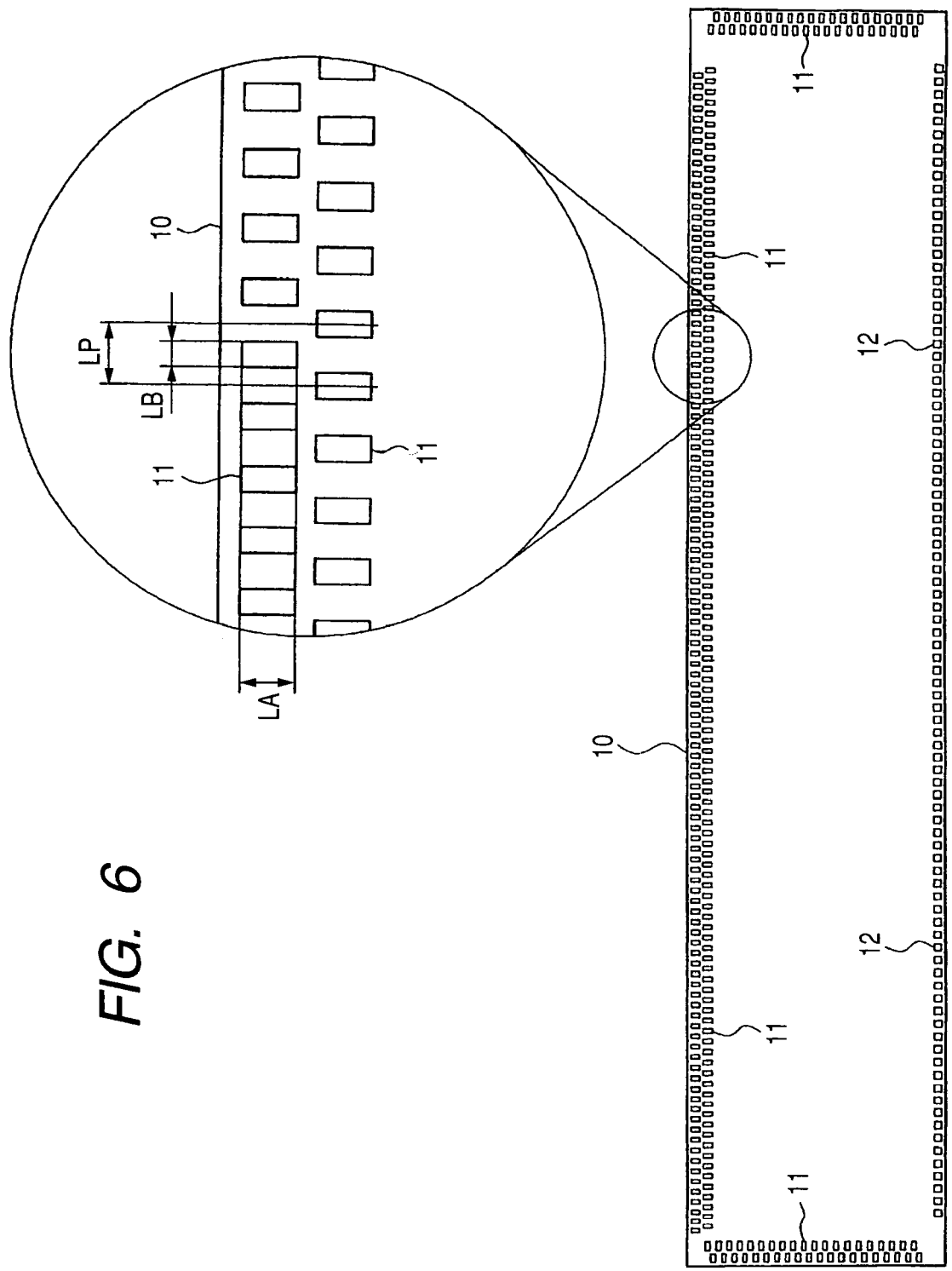
FIG. 6 is a plan view of a semiconductor chip as a target of probe testing performed by using the probe card according to the first embodiment.

In the present embodiment, chips each formed with a LCD (Liquid Crystal Display) driver can be shown as exemplary targets of probe testing (electrical testing) performed by using the probe card described above. FIG. 5 is a plan view of a wafer WH partitioned into a plurality of the chips (chip regions) 10. The probe testing using the probe card according to the present embodiment is performed with respect to the wafer WH partitioned into the chips 10. FIG. 6 shows each of the chips 10 in plan view and a part thereof in enlarged relation. The chip 10 is composed of, e.g., a monocrystalline silicon substrate and an LCD driver circuit is formed on the main surface thereof. A large number of pads (test pads (first electrodes)) 11 and 12 electrically connected to the LCD driver circuit are arranged on the peripheral portion of the main surface of the chip 10. In FIG. 6, the pads 11 arranged along the upper long side and both short sides of the chip 10 serve as output terminals, while the pads 12 arranged along the lower long side of the chip 10 serve as input terminals. Since the number of the output terminals of the LCD driver is larger than that of the input terminals thereof, the pads 11 are arranged in two rows along each of the upper long side and both short sides of the chip 10 such that the spacings between the adjacent pads 11 are maximized and the pads 11 in one and the other of the two rows along each of the upper long side and both short sides of the chip 10 are arranged in an alternating and staggered configuration. In the first embodiment, the pitch LP of the pads 11 arranged in adjacent relation is, e.g., about 68 μm. In the first embodiment, each of the pads 11 has a rectangular plan configuration. The length LA of each of the long sides of each of the pads 11 extending in directions intersecting (orthogonal to) the outer periphery of the chip 10 is about 63 μm, while the length LB of each of the short sides thereof extending along the outer periphery of the chip 10 is about 34 μm. Since the pitch LP of the pads 11 arranged in adjacent relation is about 68 μm and the length LB of each of the short sides of each of the pads 11 is about 34 μm, the spacings between the adjacent pads 11 becomes about 34 μm.

Figure 7:
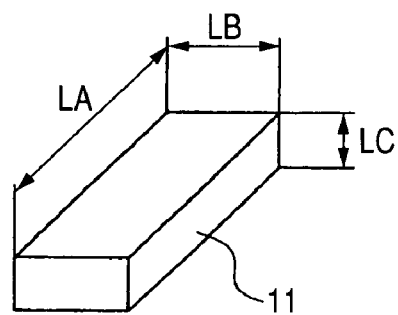
FIG. 7 is a perspective view of a pad formed on the semiconductor chip shown in FIG. 6.

The pads 11 and 12 are bump electrodes (projecting electrodes) made of, e.g., Au (gold) and formed on the input/output terminals (bonding pads) of the chip 10 by a method such as electrolytic plating, electroless plating, vapor deposition, or sputtering. FIG. 7 is a perspective view of each of the pads 11. The height LC of the pad 11 is about 15 μm. Each of the pads 12 also has the substantially same height.

The chips 10 described above can be manufactured by forming the LCD driver circuits (semiconductor integrated circuits) and the input/output terminals (bonding pads) in the large number of chip regions defined in the principal surface of the wafer by using a semiconductor manufacturing technology, forming the pads 11 on the input/output terminals by the method described above, and then dicing the wafer into the individual separate chip regions. In the first embodiment, the probe testing described above is performed with respect to each of the chip regions before the dicing of the wafer. It is assumed that, in the following description of the probe testing (the steps of contacting the probes with the pads 11 and 12), the chips 10 show the individual chip regions before the dicing of the wafer.

Figure 8:
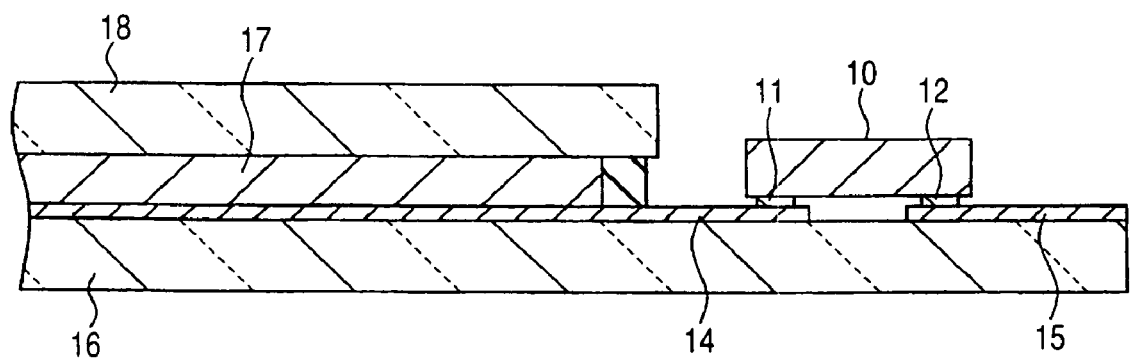
FIG. 8 is a main-portion cross-sectional view illustrating a method of connecting the semiconductor chip shown in FIG. 6 to a liquid crystal panel.

FIG. 8 is a main-portion cross-sectional view illustrating a method of connecting each of the foregoing chips 10 to a liquid crystal panel. As shown in FIG. 8, the liquid crystal panel is composed of a glass substrate 16 having pixel electrodes 14 and 15 formed on the main surface thereof, a liquid crystal layer 17, and a glass substrate 18 disposed in opposing relation to the glass substrate 16 with the liquid crystal layer 17 interposed therebetween. The first embodiment can illustrate the connection of the chip 10 to the liquid crystal panel which is achieved by facedown bonding the chip 10 such that the pads 11 and 12 are connected to the pixel electrodes 14 and 15 of the glass substrate 16 of such a liquid crystal panel.

Figure 9:
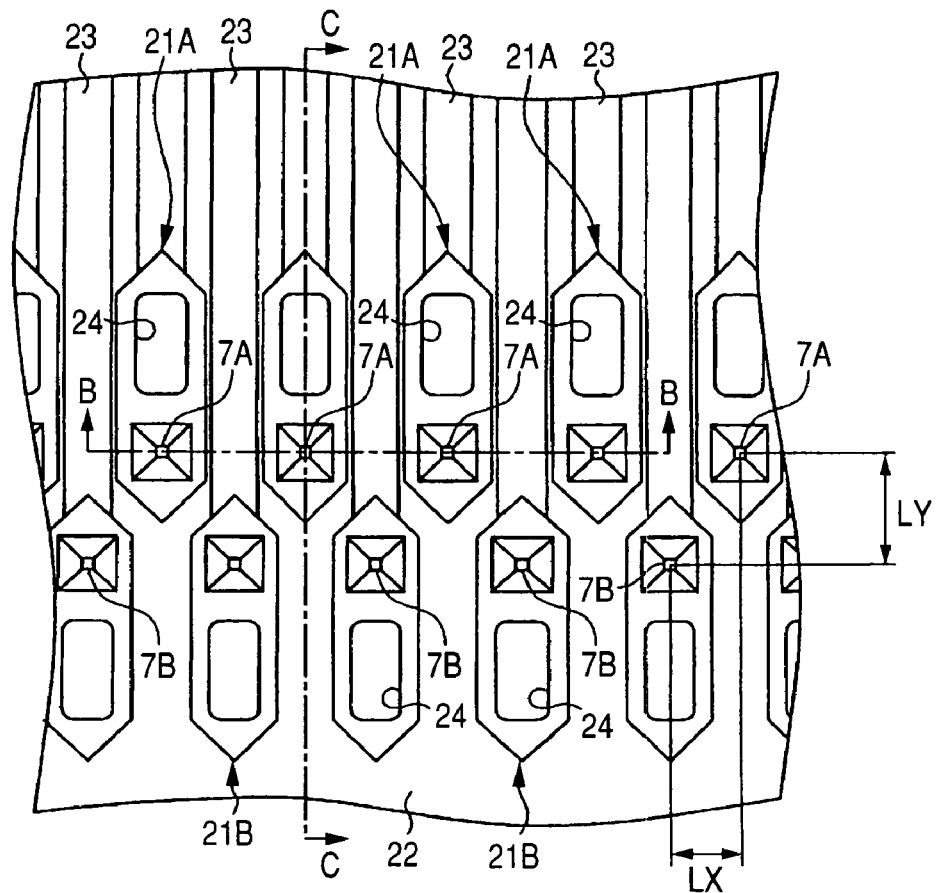
FIG. 9 is a main-portion plan view of a thin-film sheet for forming the probe card according to the first embodiment.
Figure 10:
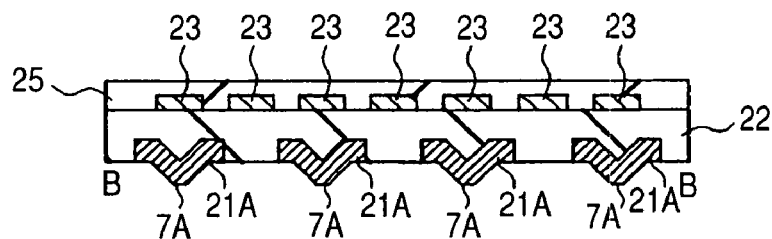
FIG. 10 is a cross-sectional view taken along the line B-B in FIG. 9.
Figure 11:
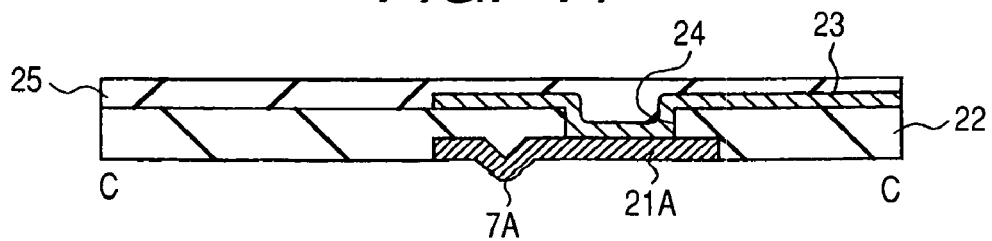
FIG. 11 is a cross-sectional view taken along the line C-C in FIG. 9.

FIG. 9 is a main-portion plan view showing a part of the region of the lower surface of the thin-film sheet 2 described above which is formed with the probes 7 in enlarged relation. FIG. 10 is a main-portion cross-sectional view taken along the line B-B in FIG. 9. FIG. 11 is a main-portion cross-sectional view taken along the line C-C in FIG. 9.

Each of the probes 7 mentioned above is a part of metal films 21A and 21B patterned into a hexagonal plan configuration in the thin-film sheet 2 and corresponds to the projecting portion of the metal films 21A and 21B in the form of a quadrilateral pyramid or a truncated quadrilateral pyramid from the lower surface of the thin-film sheet 2. The probes 7 are placed on the main surface of the thin-film sheet 2 in registration with the positions of the pads 11 and 12 formed on the foregoing chip 10. FIG. 9 shows the placement of the probes 7 corresponding to the pads 11. Of the probes 7, probes 7A correspond to the pads 11 arranged in that one of the two rows (hereinafter referred to as the first row) which is closer to the outer periphery of the chip 10 and probes 7B correspond to the pads 11 in the other of the two rows (hereinafter referred to as the second row) which is more distant from the outer periphery of the chip 10. The distance between one of the probes 7A and that one of the probes 7B at the closest position is defined by each of the distance LX in the lateral direction of the surface of the paper sheet with FIG. 9 and the distance LY in the vertical direction thereof. The distance LX is about 34 μm which is half the pitch LP of the pads 11 arranged in adjacent relation described above. In the first embodiment, the distance LY is about 93 μm.

The metal films 21A and 21B are composed of a rhodium film and a nickel film stacked successively in layers in an ascending order. A polyimide film 22 is formed over the metal films 21A and 21B and wires (second wires) 23 electrically connected to the individual metal films 21 are formed on the polyimide film 22. The wires 23 are in contact with the metal films 21A or 21B at the bottom portions of the through holes 24 formed in the polyimide film 22. Further, a polyimide film 25 is formed over the polyimide film 22 and the wires 23.

As described above, the parts of the metal films 21A and 21B form the probes 7A and 7B each configured as a quadrilateral pyramid or a truncated quadrilateral pyramid, while the through holes 24 reaching the metal films 21A or 21B are formed in the polyimide film 22. Therefore, when the 2D pattern of the metal film 21A formed with the probes 7A including the through holes 24 and the 2D pattern of the metal film 21B formed with the probes 7B including the through holes 24 are arranged in the same direction, the adjacent metal films 21A and 21B come in contact with each other. As a result, there may be the problem that independent inputs and outputs cannot be obtained from the probes 7A and 7B. To prevent the problem, the first embodiment uses a pattern obtained by 180° rotating the 2D pattern of the metal film 21A formed with the probes 7A including the through holes 24 as the 2D pattern of the metal film 21B formed with the probes 7B including the through holes 24. This prevents the wider 2D region of the metal film 21A in which the probes 7A and the through holes 24 are arranged and the wider 2D region of the metal film 21B in which the probes 7B and the through holes 24 are arranged from being aligned in a straight line extending in the lateral direction of the surface of the paper sheet. Consequently, the respective vertically tapered regions of the metal films 21A and 21B are aligned in a straight line extending in the lateral direction of the surface of the paper sheet. As a result, the problem that the adjacent metal films 21A and 21B come in contact with each other can be prevented. Even when the pads 11 are arranged with a narrow pitch (see FIG. 6), the probes 7A and 7B can be placed at the positions corresponding thereto.

Figure 12:
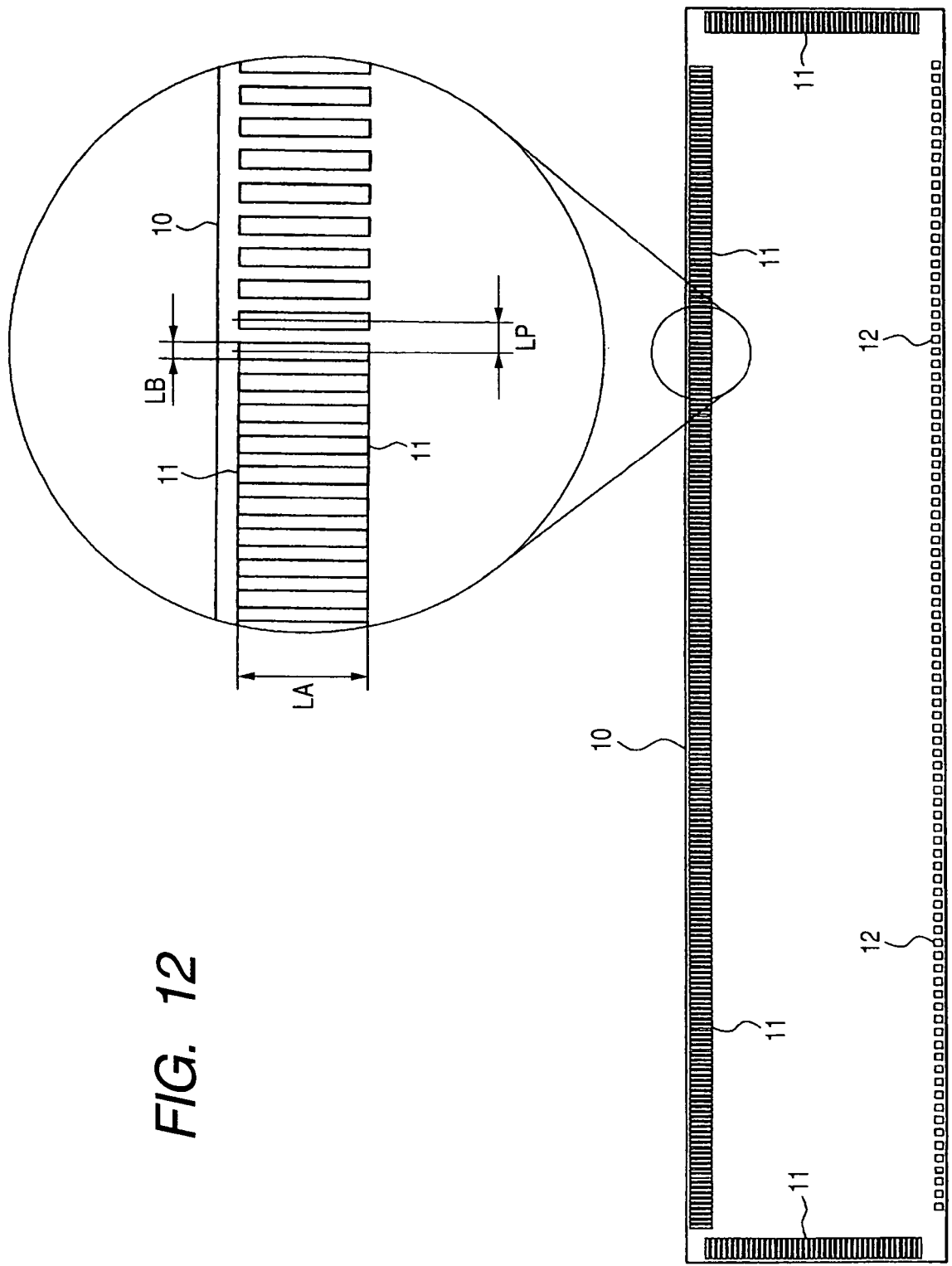
FIG. 12 is a plan view of a semiconductor chip as a target of probe testing performed by using the probe card according to the first embodiment.
Figure 13:
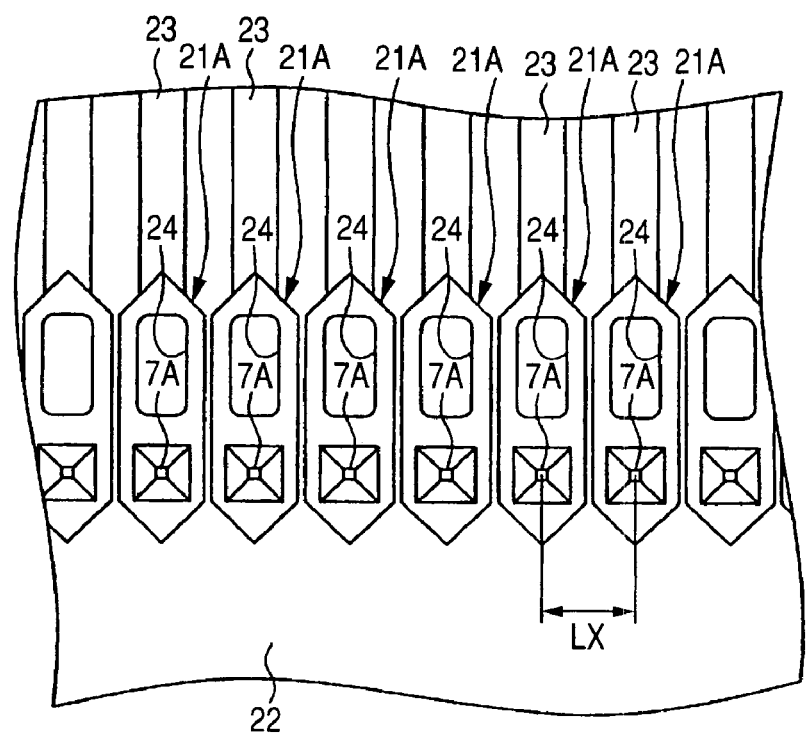
FIG. 13 is a main-portion plan view of a thin-film sheet for forming the probe card according to the first embodiment.
Figure 14:
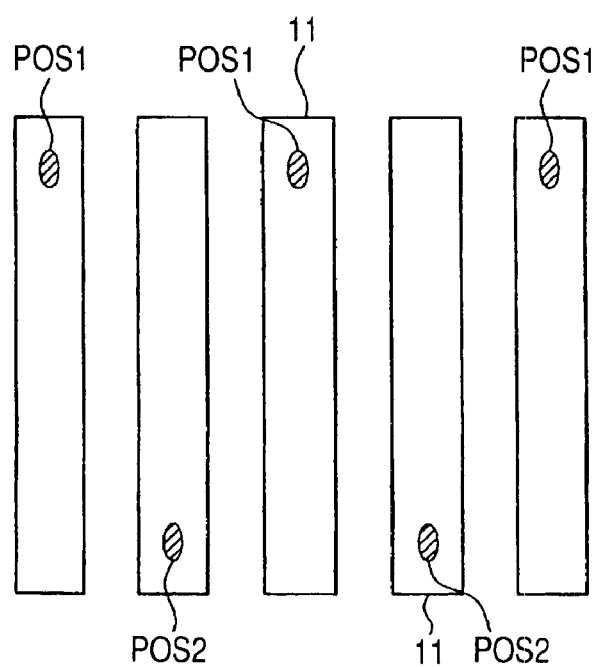
FIG. 14 is a main-portion plan view showing positions on bump electrodes provided on a semiconductor chip as a target of probe testing performed by using the probe card according to the first embodiment with which probes come in contact.

Although the present embodiment has described the case where the pads 11 are arranged in two rows with reference to FIG. 6, there are also chips arranged in one row, as shown in FIG. 12. Provisions can be made for such chips by using the thin-film sheet 2 in which the wider regions of the metal films 21A are aligned in a straight line extending in the lateral direction of the surface of the paper sheet, as shown in FIG. 13. In the case where the pads 11 are thus arranged in one row, the length LA of each of the long sides extending in the directions intersecting (orthogonal to) the outer periphery of the chip 10 is, e.g., about 140 μm, the length LB of each of the short sides extending along the outer periphery of the chip 10 is, e.g., about 19 μm, the pitch LP of the pads 11 arranged in adjacent relation is, e.g., about 34 μm, and the spacing between the adjacent pads 11 is about 15 μm, the long side is about double the long side of the pad 11 shown in FIG. 6 and the center positions of the pads 11 in the short side direction are allowed to coincide with the center positions of the pads 11 shown in FIG. 6. As a result, it becomes possible to use the thin-film sheet 2 described with reference to FIGS. 9 to 11 and, consequently, the probes 7A and 7B come in contact with the pads 11 at the positions POS1 and POS2 shown in FIG. 14.

Figure 15:
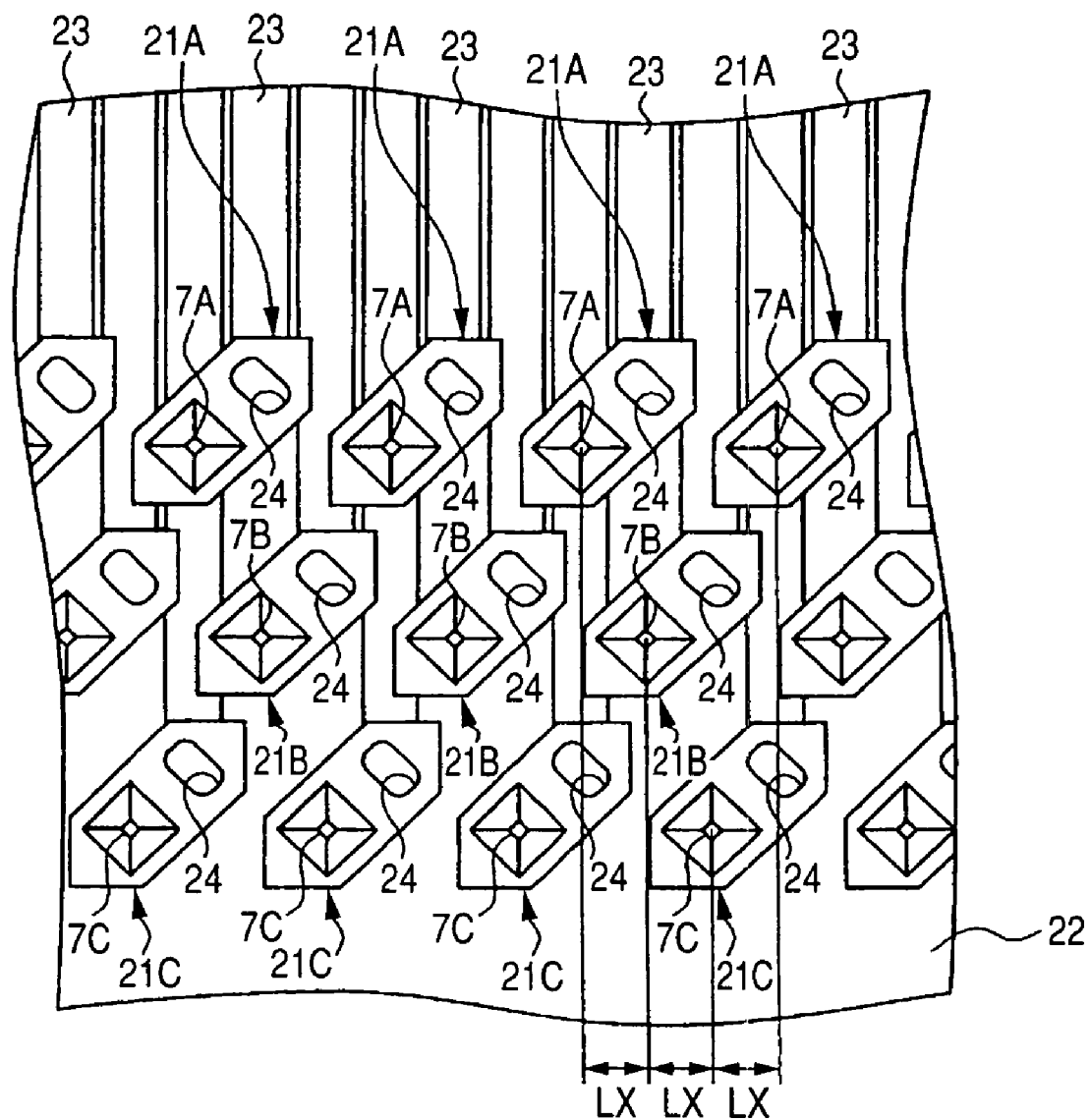
FIG. 15 is a main-portion plan view of a thin-film sheet for forming the probe card according to the first embodiment.
Figure 16:
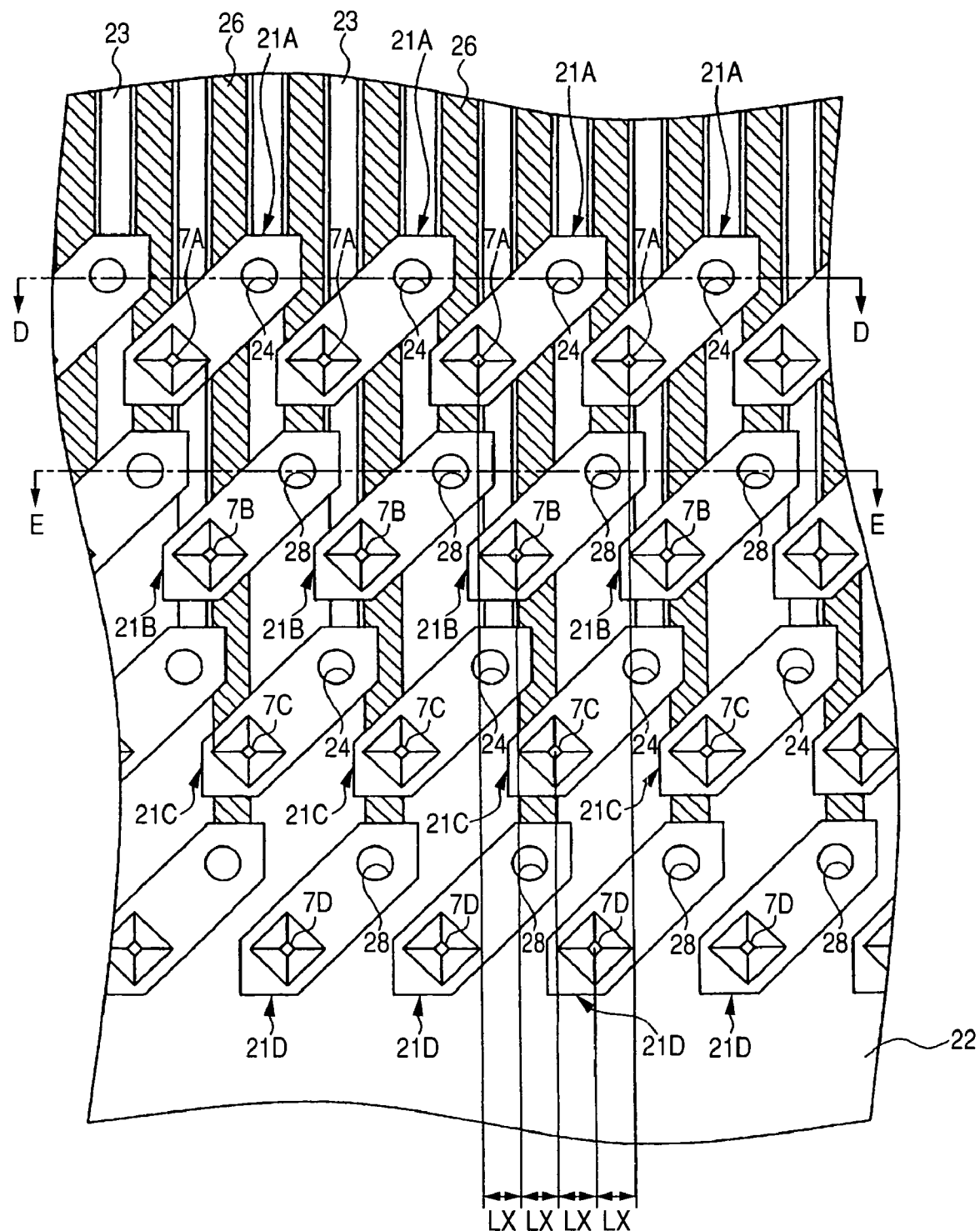
FIG. 16 is a main-portion plan view of a thin-film sheet for forming the probe card according to the first embodiment.

When the number of the pads 11 is larger, there are cases where the pads 11 are arranged in three or more rows. FIG. 15 is a main-portion plan view of the thin-film sheet 2 corresponding to the pads 11 arranged in three rows. FIG. 16 is a main-portion plan view of the thin-film sheet 2 corresponding to the pads 11 arranged in four rows. If the chips 10 are of the same size, the distance LX described with reference to FIG. 9 is smaller as the number of the rows in which the pads 11 are arranged is larger. As a result, there may be the problem that the metal films including the metal films 21A and 21B come in contact with each other. Therefore, by 45° rotating the 2D pattern for the metal film 21A shown in, e.g., FIG. 9 and using the resultant 2D pattern for each of the metal films 21A, 21B, 21C, and 21D as shown in FIGS. 15 and 16, it becomes possible to prevent the problem of mutual contact between the metal films 21A, 21B, 21C, and 21D. Although the description has been given herein to the example in which the 2D pattern of the metal film 21A shown in FIG. 9 is 45° rotated, the rotation angle is not limited to 45°. Another rotation angle may also be used provided that it can prevent the mutual contact between the metal films 21A, 21B, 21C, and 21D. The metal films 21C are formed with probes 7C corresponding to the pads 11 arranged in the region of the chip 10 inner than the region thereof in which the pads 11 corresponding to the probes 7B are arranged. The metal films 21D are formed with probes 7D corresponding to the pads 11 arranged in the region of the chip 10 inner than the region thereof in which the pads 11 corresponding to the probes 7C are arranged.

Figure 17:
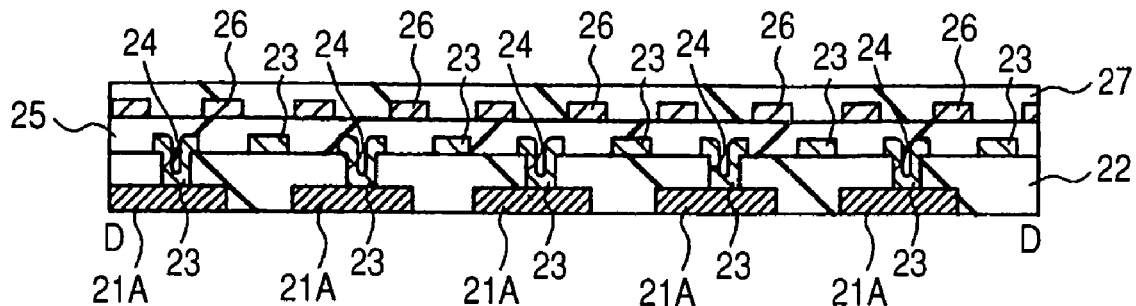
FIG. 17 is a cross-sectional view taken along the line D-D in FIG. 16.
Figure 18:
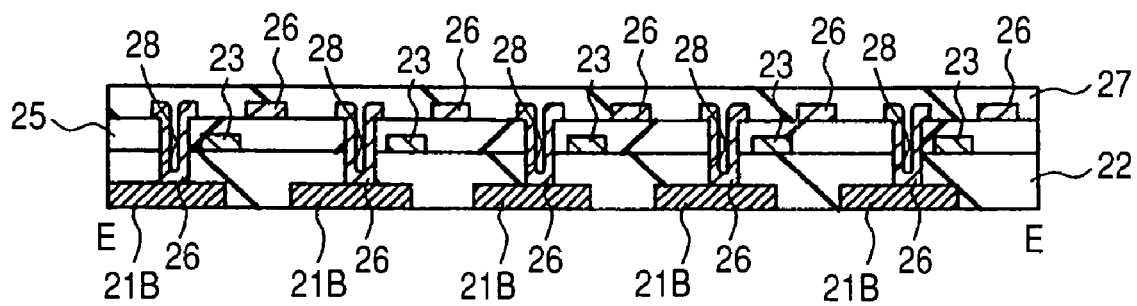
FIG. 18 is a cross-sectional view taken along the line E-E in FIG. 16.

FIG. 17 is a main-portion cross-sectional view taken along the line D-D in FIG. 16. FIG. 18 is a main-portion cross-sectional view taken along the line E-E in FIG. 16. As shown in FIG. 16, when the metal films 21A to 21D having the probes 7A to 7D corresponding to the pads 11 in four rows are arranged, it becomes difficult to form each of wires electrically connected from the upper layer to the individual metal films 21A to 21D from the same wiring layer. This is because the problem of mutual contact between the metal films 21A to 21D may occur due to a reduction in the distance LX mentioned above and the problem of mutual contact between the wires electrically connected to the metal films 21A to 21D may also occur. To present the problems, the present embodiment can illustrate the formation of these wires from two wiring layers (wires 23 and 26), as shown in FIGS. 17 and 18. It is to be noted that a polyimide film 27 has been formed over the wires 26 and the polyimide film 25. The wires 23 in the lower layer are in contact with the metal films 21A or 21C at the bottom portions of the through holes 24 formed in the polyimide film 22, while the wires 26 in the upper layer are in contact with the metal films 21B or 21D at the bottom portions of through holes 28 formed in the polyimide films 22 and 25. As a result, it becomes possible to maintain large spacings between the adjacent wires 23 or 26 in the same wiring layer and thereby prevent the problem of contact between the adjacent wires 23 or 26. When the pads 11 are arranged in five or more rows and the distance LX mentioned above is reduced as the number of the probes corresponding thereto increases, the spacings between wires may also be increased by forming more multiple wiring layers.

The structure of the thin-film sheet 2 according to the first embodiment and the manufacturing steps thereof will be described collectively with reference to FIGS. 19 to 24. FIGS. 19 to 24 are main-portion cross-sectional views of the thin-film sheet 2 in the manufacturing steps thereof, which has the probes 7A and 7B corresponding to the pads 11 (see FIG. 6) arranged in two rows and has been described above with reference to FIGS. 9 to 11. The structure and manufacturing steps of the thin-film sheet and the structure and manufacturing steps of probes similar to the probes 7 (probes 7A to 7D) described above are also described in Japanese Patent Application Nos. 2003-75429, 2003-371515, 2003-372323, and 2004-115048, PCT Application Nos. PCT/JP2004/17160 and PCT/JP2005/4344, and Japanese Patent Application Nos. 2005-109350 and 2005-168112.

Figure 19:
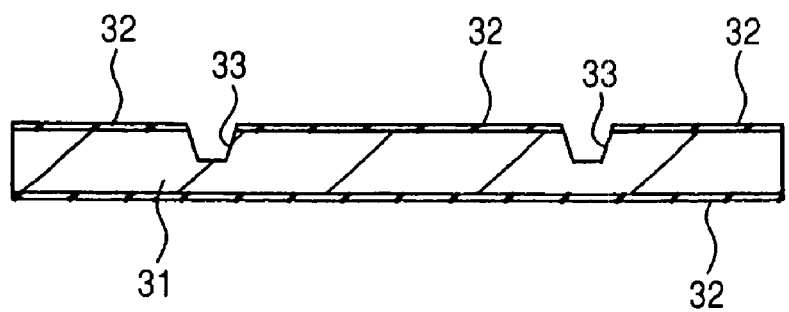
FIG. 19 is a main-portion cross-sectional view illustrating the step of manufacturing a thin-film sheet for forming the probe card according to the first embodiment.

First, as shown in FIG. 19, a wafer 31 made of silicon and having a thickness of about 0.2 mm to 0.6 mm is prepared and a silicon dioxide film 32 having a thickness of about 0.5 μm is formed on each of the both surfaces of the wafer 31 by thermal oxidation. Subsequently, the silicon dioxide film 32 on the main surface of the wafer 31 is etched by using a photoresist film as a mask so that openings reaching the wafer 31 are formed in the silicon dioxide film 32 on the main surface of the wafer 31. Then, the wafer 31 is anisotropically etched by using an aqueous strong alkali solution (e.g., an aqueous potassium hydroxide solution) and using the remaining portion of the silicon dioxide film 32 as a mask so that holes 33 each configured as a quadrilateral pyramid or a truncated quadrilateral pyramid and surrounded by the (111) plane are formed in the main surface of the wafer 31.

Figure 20:
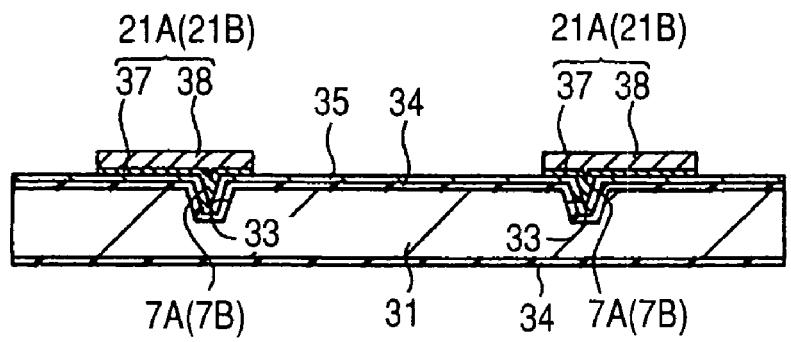
FIG. 20 is a main-portion cross-sectional view of the thin-film sheet in the manufacturing step thereof subsequent to that illustrated in FIG. 19.

Next, as shown in FIG. 20, the silicon dioxide film 32 used as the mask during the formation of the holes 33 is removed by wet etching using a solution mixture of hydrofluoric acid and ammonium fluoride. Subsequently, a thermal oxidation process is performed with respect to the wafer 31, thereby forming a silicon dioxide film 34 having a thickness of about 0.5 μm over the entire surface of the wafer 31 including the insides of the holes 33. Then, a conductive film 35 is formed over the main surface of the wafer 31 including the insides of the holes 33. The conductive film 35 can be formed by successively depositing a chromium film having a thickness of about 0.1 μm and a copper film having a thickness of about 1 μm by sputtering or vapor deposition. Then, a photoresist film is formed on the conductive film 35 and the portions of the photoresist film corresponding to the regions to be formed with the metal films 21A and 21B (see FIGS. 9 to 11) in the subsequent step are removed by a photolithographic technique so that openings are formed.

Next, a high hardness conductive film 37 and a conductive film 38 are successively deposited on the conductive film 35 appearing at the bottom portion of each of the openings in the photoresist film by electrolytic plating using the conductive film 35 as an electrode. The first embodiment can illustrate the use of a rhodium film as the conductive film 37 and the use of a nickel film as the conductive film 38. By the steps performed thus far, the metal films 21A and 21B described above can be formed from the conductive films 37 and 38. The conductive films 37 and 38 in the holes 33 form the probes 7A and 7B described above. The conductive film 35 is removed in the subsequent step, which will be described later.

In each of the metal films 21A and 21B, the conductive film 37 formed of the rhodium film forms the surface when the probes 7A and 7B described above are formed in the subsequent step so that the conductive film 37 comes in direct contact with the pads 11. For the conductive film 37, therefore, a material high in hardness and excellent in abrasive resistance is preferably selected. Since the conductive film 37 comes in direct contact with the pads 11, when the cuttings of the pads 11 scraped off by the probes 7A and 7B adhere to the conductive film 37, a cleaning step for removing the cuttings becomes necessary and the problem of the extended probe testing step may occur. To prevent this, a material to which the material composing the pads 11 is less likely to adhere is preferably selected for the conductive film. Therefore, the first embodiment has selected the rhodium film which satisfies the requirement for the conductive film 37. As a result, the cleaning step can be omitted.

Figure 21:
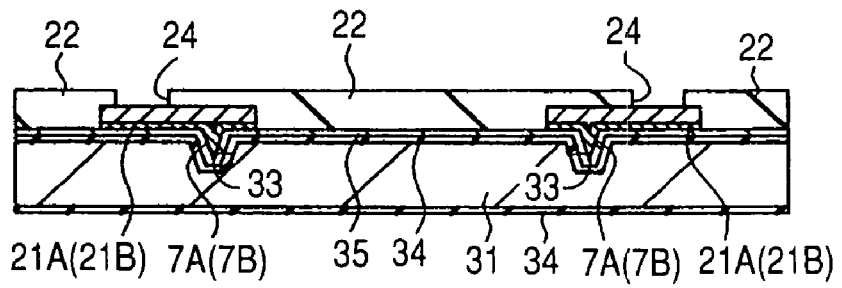
FIG. 21 is a main-portion cross-sectional view of the thin-film sheet in the manufacturing step thereof subsequent to that illustrated in FIG. 20.

After the photoresist film used to form the metal films 21A and 21B (conductive films 37 and 38) is removed, the polyimide film 22 (see also FIGS. 10 and 11) is also formed to cover the metal films 21A and 21B and the conductive film 35, as shown in FIG. 21. Subsequently, the foregoing through holes 24 reaching the metal films 21A or 21B are formed in the polyimide film 22. The through holes 24 can be formed by a punching process using a laser or by dry etching using an aluminum film as a mask.

Figure 22:
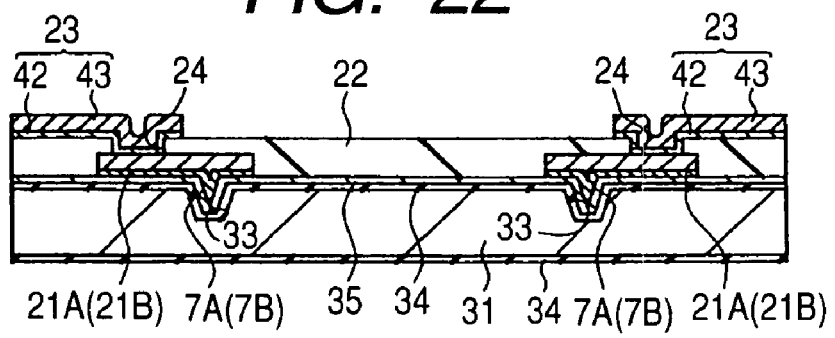
FIG. 22 is a main-portion cross-sectional view of the thin-film sheet in the manufacturing step thereof subsequent to that illustrated in FIG. 21.

Next, as shown in FIG. 22, a conductive film 42 is formed over the polyimide film 22 including the insides of the through holes 24. The conductive film 42 can be formed by successively depositing, e.g., a chromium film having a thickness of about 0.1 µm and a copper film having a thickness of about 1 µm by sputtering or vapor deposition. Subsequently, a photoresist film is formed on the conductive film 42 and patterned by a photolithographic technique so that openings reaching the conductive film 42 are formed in the photoresist film. Then, a conductive film 43 is formed by plating on the conductive film 42 in each of the openings. As an example of the conductive film 43, the first embodiment can show a copper film or a multilayer film composed of a copper film and a nickel film deposited successively in layers in an ascending order.

Next, the photoresist film is removed and then the conductive film 42 is etched by using the conductive film 43 as a mask so that the wires 23 composed of the conductive films 42 and 43 are formed. The wires 23 can be electrically connected to the metal films 21A or 21B at the bottom portions of the through holes 24.

Figure 23:
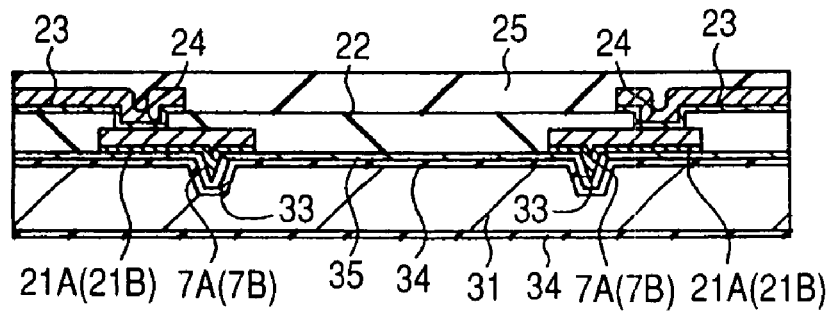
FIG. 23 is a main-portion cross-sectional view of the thin-film sheet in the manufacturing step thereof subsequent to that illustrated in FIG. 22.
Figure 24:
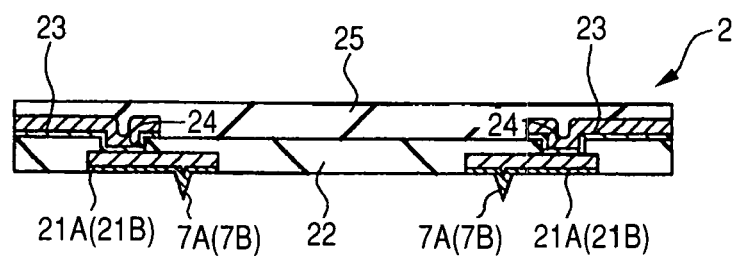
FIG. 24 is a main-portion cross-sectional view of the thin-film sheet in the manufacturing step thereof subsequent to that illustrated in FIG. 23.

Next, as shown in FIG. 23, the polyimide film 25 described above is formed on the main surface of the wafer 31. Subsequently, as shown in FIG. 24, the silicon dioxide film 34 on the back surface of the wafer 31 is removed therefrom by etching using a solution mixture of, e.g., hydrofluoric acid and ammonium fluoride. Subsequently, the wafer 31 as a mold material for forming the thin-film sheet 2 is removed by etching using an aqueous strong alkali solution (e.g., an aqueous potassium hydroxide solution). Then, the silicon dioxide film 34 and the conductive film 35 are successively removed by etching, whereby the thin-film sheet 2 according to the first embodiment is manufactured. At this time, the silicon dioxide film 34 is etched by using a solution mixture of hydrofluoric acid and ammonium fluoride. The chromium film included in the conductive film 35 is etched by using an aqueous potassium permanganate solution, while the copper film included in the conductive film 35 is etched by using an alkaline copper etching solution. By the steps performed thus far, the rhodium film as the conductive film 37 (see FIG. 20) forming the probes 7A and 7B appears at the surface of each of the probes 7A and 7B. As described above, Au or the like as the material of the pads 11 with which the probes 7A and 7B come in contact is less likely to adhere to the probes 7A and 7B each having the rhodium film formed on the surface thereof. Since the rhodium film is higher in hardness than Ni and more resistant to oxidation, contact resistance can be stabilized.

As necessary, wiring can be formed in more multiple layers by repeating the steps of forming the through holes 24, the wires 23, and the polyimide film 25.

A description will be given next to the main-portion steps when the thin-film sheet 2 is attached to the probe card (see FIGS. 1 to 4) according to the first embodiment.

Figure 25:
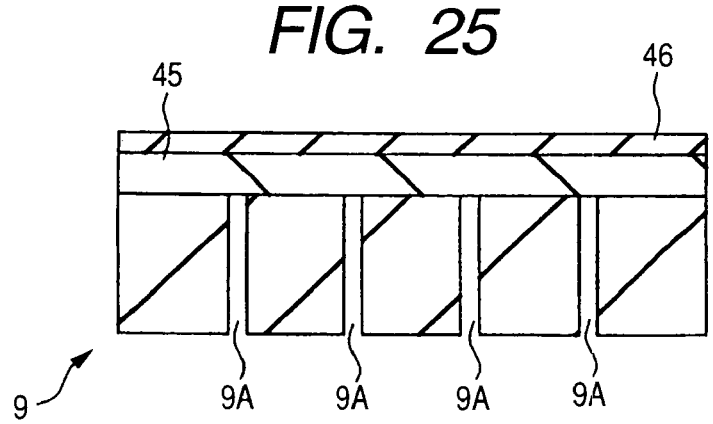
FIG. 25 is a main-portion cross sectional view illustrating the step of attaching the thin-film sheet manufactured in the steps illustrated in FIGS. 19 to 24 to the probe card.

First, as shown in FIG. 25, the pressing tool 9 described above with reference to FIG. 3 is prepared. The pressing tool 9 has a main surface (first main surface) finally opposing the thin-film sheet 2, a back surface (first back surface) opposite to the main surface, and at least one hole portion (first hole portion) 9A formed therein and extending therethrough between the main and back surfaces. The first embodiment can illustrate an example in which a plurality of the hole portions 9A each having a diameter of about 50 µm are provided such that any adjacent two thereof have a spacing of about 1 mm to 1.5 mm therebetween. The function of the holes 9A will be described later in detail.

Next, the main surface of the pressing tool 9 is directed upward and an elastomer (impact reducing means) 45 in the form of a sheet with a thickness of about 50 µm is disposed on the main surface of the pressing tool 9. The elastomer 45 reduces an impact when the tips of the large number of probes 7A and 7B come in contact with the pads 11, while accommodating variations in the heights of the tips of the individual probes 7A and 7B through local deformation, and thereby achieves contact between the probes 7A and 7B and the pads 11 by evenly jamming the tip portions of the probes 7A and 7B into the pads 11 despite the variations in the heights of the pads 11.

Subsequently, a polyimide sheet (impact reducing means) 46 having a thickness of about 12.5 µm is disposed on the elastomer 45. At this time, the elastomer 45 underlying the polyimide sheet 46 is sucked onto the main surface of the pressing tool 9 by an electrostatic attraction force and the polyimide sheet 46 is also sucked onto the elastomer 45 by the electrostatic attraction force. As a result, the elastomer 45 and the polyimide sheet 46 do not fall off the pressing tool 9 even when the pressing tool 9 is inverted.

Next, the pressing tool 9 is disposed on the thin-film sheet 2 with the main surface thereof facing the back surface (the surface opposite to the main surface formed with the probes 7) of the thin-film sheet 2, while the elastomer 45 and the polyimide sheet 46 are still electrostatically attracted to the pressing tool 9. At this time, the region to which the pressing tool 9 is bonded corresponds to the region of the main surface formed with the probes 7.

Thereafter, the thin-film sheet 2 to which the pressing tool 9 has thus been bonded is attached to the probe card according to the first embodiment and then adjustments are made. The adjustments made herein include the adjustment of the amount of extrusion (corresponding to the height HT (see FIG. 1) from the surface of the multilayer wiring board 1 to the probe surface of the thin-film sheet 2) of the thin-film sheet 2 from the surface of the multilayer wiring board 1 under the pressing force of the pressing tool 9 and the registration of the respective tips of the probes 7 (vertical registration and horizontal registration in a plane with the corresponding pads 11, 12).

Figure 26:
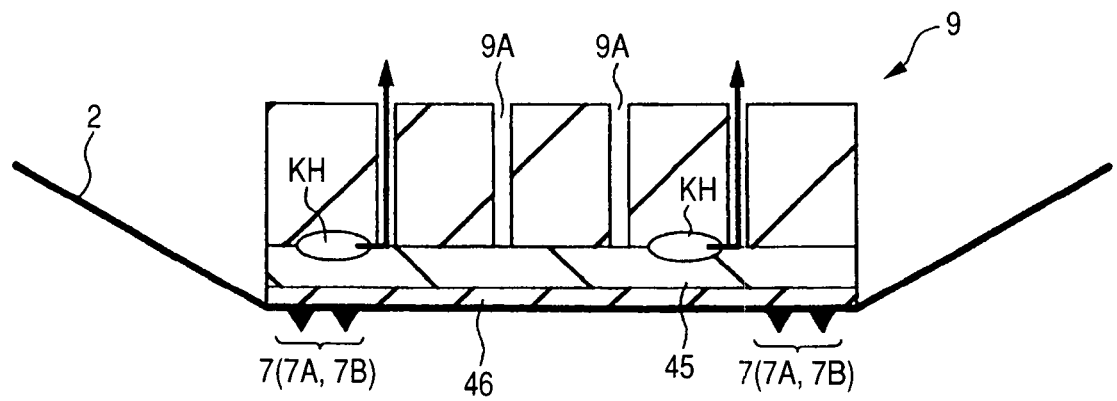
FIG. 26 is a main-portion cross-sectional view illustrating the removal of gas bubbles from between the thin-film sheet for forming the probe card according to the first embodiment and a pressing tool.

In the probe card according to the first embodiment after the completion of the attachment and adjustments thereof, gas bubbles KH might have been trapped between the pressing tool 9 and the elastomer 45 when the elastomer 45 is placed on the main surface of the pressing tool 9, as shown in FIG. 26. When such gas bubbles KH have been trapped between the pressing tool 9 and the elastomer 45, they may thermally expand in a high-temperature environment during probe testing. Consequently, there may be a situation in which, when the pressing tool 9 applies a pressing force to bring the probes 7A and 7B into contact with the pads 11 and 12 on the chip 10 (see FIGS. 6 and 12) during probe testing, the gas bubbles KH absorb the pressing force and the probes 7A and 7B cannot reliably contact the pads 11 and 12.

To prevent this, the first embodiment has provided the hole portions 9A described above in the pressing tool 9 and thereby allows the removal of the thermally expanded gas bubbles KH from the hole portions 9A to the outside of the probe card. Since the gas bubbles KH fluidly move between the pressing tool 9 and the elastomer 45, they can be released from any of the hole portions 9A (see FIG. 26). This can prevent the gas bubbles KH from absorbing the pressing force when it is applied by the pressing tool 9 and reliably contact the probes 7A and 7B with the pads 11 and 12.

Even when the elastomer 45 and the polyimide sheet 46 are disposed on the main surface of the pressing tool 9, the gas bubbles KH may be trapped in the respective interfaces thereof. There may also be a situation in which, even when the gas bubbles KH have thus been trapped, the gas bubbles KH expand in a high-temperature atmosphere during probe testing to absorb the pressing force applied by the pressing tool 9 and the probes 7 (7A, 7B) cannot reliably contact the pads 11 and 12.

Figure 27:
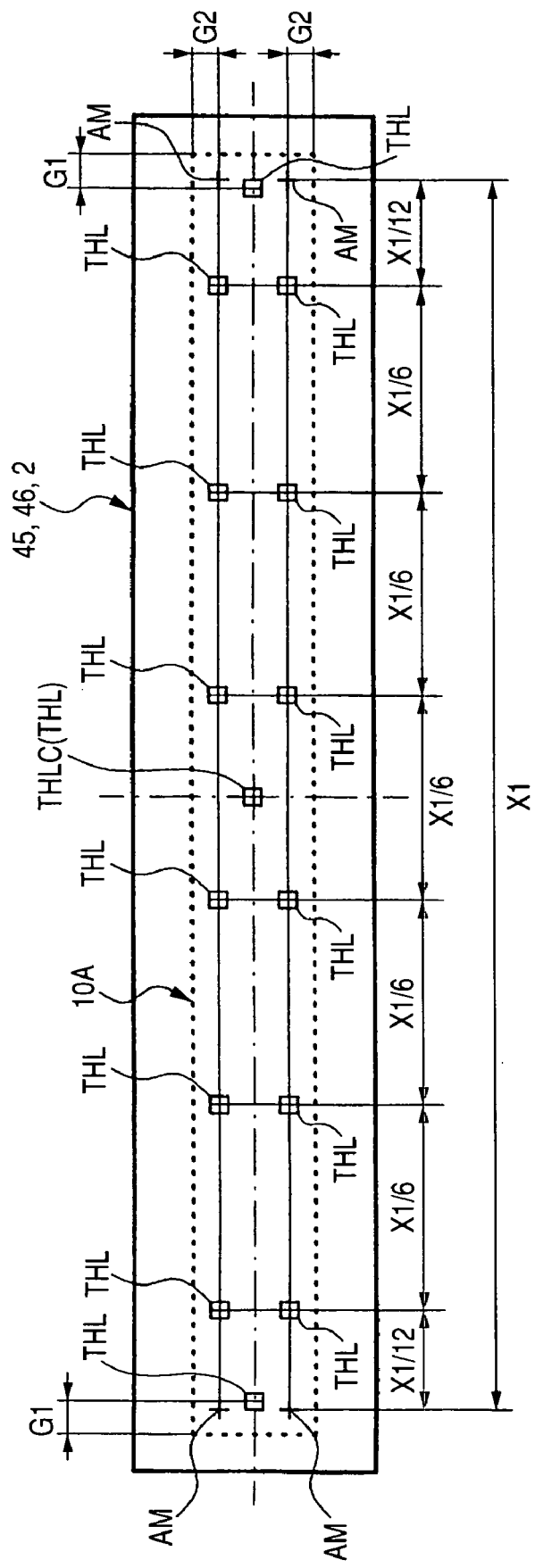
FIG. 27 is a main-portion plan view illustrating the thin-film sheet for forming the probe card according to the first embodiment and hole portions provided in each of an elastomer and a polyimide sheet disposed between the thin-film sheet and the pressing tool.
Figure 28:
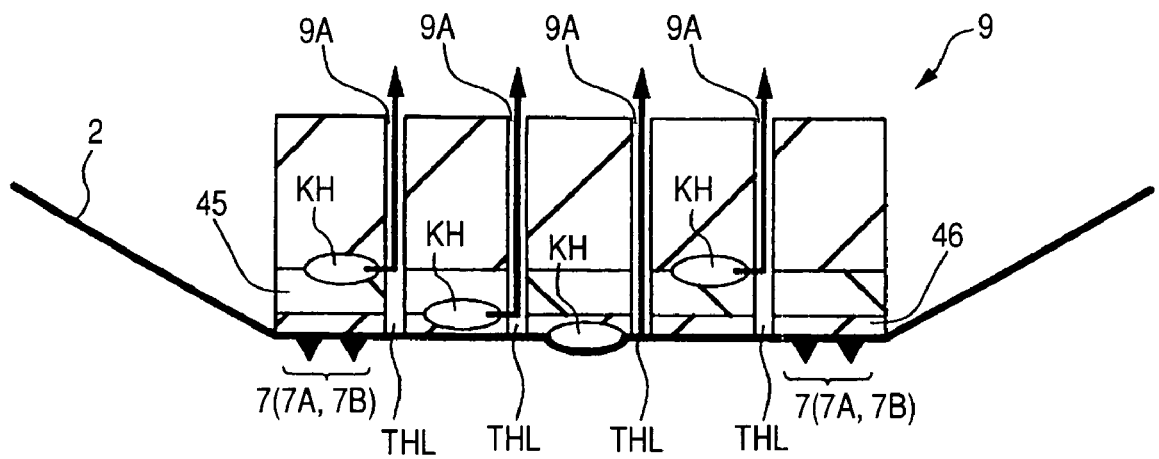
FIG. 28 is a main-portion cross-sectional view illustrating the thin-film sheet for forming the probe card according to the first embodiment and the hole portions provided in each of the elastomer and the polyimide sheet disposed between the thin-film sheet and the pressing tool and also illustrating degassing from the hole portions.

To prevent this, the first embodiment preliminarily forms hole portions (second hole portions) THL (see FIGS. 27 and 28) each having a diameter of about 50 µm to 150 µm in each of the elastomer 45 and the polyimide sheet 46 such that they extend therethrough between the top and back surfaces thereof before disposing the elastomer 45 and the polyimide sheet 46 on the main surface of the pressing tool 9. The hole portions THL can be formed by, e.g., punching. By thus forming the hole portions THL, the gas bubbles KH can be removed from the hole portions THL even when the gas bubbles KH have been trapped in the respective interfaces of the elastomer 45 and the polyimide sheet 46. In other words, it becomes possible to reliably contact the probes 7 (7A, 7B) with the pads 11 and 12 during probe testing. Since the movement of the gas bubbles KH is fluid, the number of the hole portions THL, the aperture diameters thereof, the aperture positions thereof in a plane, and the like need not be the same for each of the elastomer 45 and the polyimide sheet 46. The hole portions THL may also be formed only in the elastomer 45.

Figure 29:
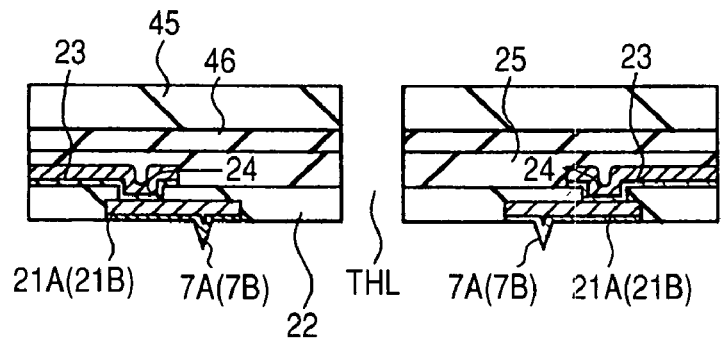
FIG. 29 is a main-portion cross-sectional view illustrating the step of forming hole portions in the thin-film sheet for forming the probe card according to the first embodiment and in each of the elastomer and the polyimide sheet disposed between the thin-film sheet and the pressing tool by using a laser.
Figure 30:
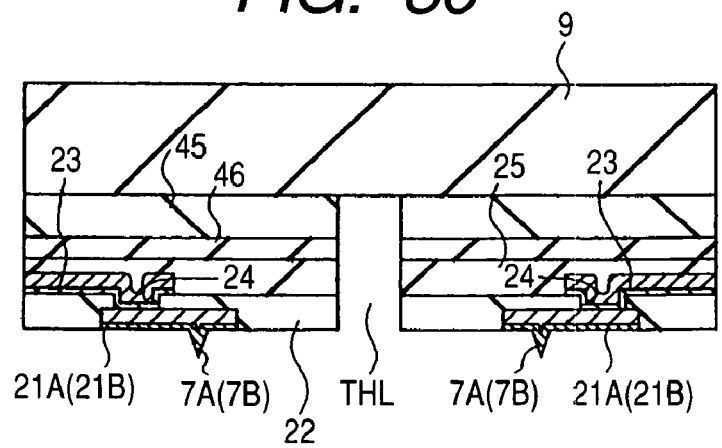
FIG. 30 is a main-portion cross-sectional view illustrating the step of disposing the pressing tool on the elastomer in the step subsequent to that illustrated in FIG. 29.
Figure 31:
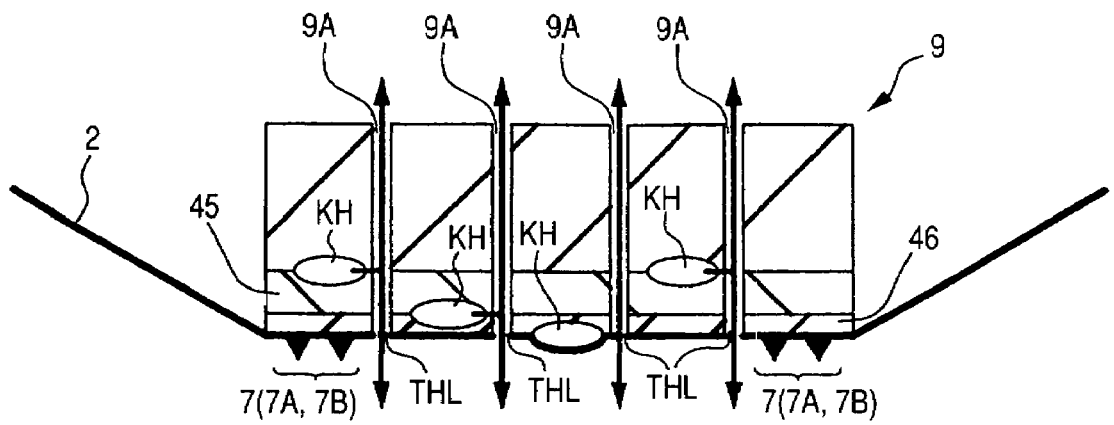
FIG. 31 is a main-portion cross-sectional view illustrating the hole portions provided in the thin-film sheet for forming the probe card according to the first embodiment and in each of the elastomer and the polyimide sheet disposed between the thin-film sheet and the pressing tool and also illustrating degassing from the hole portions.

Hole portions (third hole portions) similar to the hole portions THL described above may also be provided in the thin-film sheet 2. In this case, the hole portions are formed to avoid the portions formed with the probes 7 (7A, 7B), the metal films 21A and 21B, and the wires 23. The hole portions in the thin-film sheet 2 can be formed simultaneously with the hole portions THL described above by processing using, e.g., a laser. That is, the elastomer 45 and the polyimide sheet 46 are not disposed on the thin-film sheet 2 by the method which electrostatically attracts them to the pressing tool 9, as described with reference to FIG. 25. Instead, the polyimide sheet 46 and the elastomer 45 are disposed in this order on the back surface of the thin-film sheet 2 and, after the hole portions THL are opened in the thin-film sheet 2, the elastomer 45 and the polyimide sheet 46 by using a laser (see FIG. 29), the pressing tool 9 is disposed on the elastomer 45 (see FIG. 30). By thus forming the hole portions THL also in the thin-film sheet 2, it becomes possible to remove the gas bubbles KH also from the hole portions THL in the thin-film sheet 2 (see FIG. 31).

A description will be given herein below to the positions of the hole portions THL formed in thin-film sheet 2, the polyimide sheet 46, and the elastomer 45. The region indicated by the dotted square in FIG. 27 described above is the region 10A corresponding to the outer configuration of the chip 10. The alignment mark AM is used for registration during the assembly of the probe card and for registration with the chip 10 during probe testing. As described above, the hole portions THL are formed to avoid the portions formed with the probes 7 (7A, 7B), the metal films 21A and 21B, and the wires 23. Since the probes 7 (7A, 7B), the metal films 21A and 21B, and the wires 23 are formed in the portions extending from the outer end portions of the region 10A which are indicated by G1 (the lateral direction of the surface of the paper sheet) and G2 (the vertical direction of the surface of the paper sheet) in FIG. 27, the hole portions THL are formed in the portion inner than the regions indicated by G1 and G2. The first embodiment can illustrate an example in which, when the distance between the two alignment marks AM in the lateral direction of the surface of the paper sheet is assumed to be X1, the hole portions THL are positioned with the spacings of X1/12, X1/6, X1/6, X1/6, X1/6, and X1/12 between the two alignment marks AM. It is also possible to position a hole portion (second hole portion) THLC having a diameter larger than that of each of the other hole portions THL in the center of the region 10A.

Although the first embodiment can illustrate an example in which the hole portions THL are formed in the same 2D layout as in the case where the processing using the laser is performed even in the case where the hole portions THL are formed in the elastomer 45 and the polyimide sheet 46 by punching described above, the 2D layout is not limited thereto.

It is also possible to combine the foregoing step of forming the hole portions THL by punching with the step of forming the hole portions THL using the laser. Specifically, the hole portions THL are formed in the elastomer 45 and in the polyimide sheet 46 by punching, while the hole portions THL are formed in the thin-film sheet 2 by using the laser. Alternatively, it is also possible to form the hole portions THL by punching only in the elastomer 45 and form the hole portions THL in the thin-film sheet 2 and the polyimide sheet 46 by using the laser. When the steps of forming the hole portions THL are performed in combination, the number of the hole portions THL, the aperture diameters thereof, the aperture positions thereof in a plane, and the like need not be the same for each of the thin-film sheet 2, the elastomer 45, and the polyimide sheet 46 since the movement of the gas bubbles KH is fluid along each of the interfaces.

When the hole portions THL are provided in each of the thin-film sheet 2, the elastomer 45, and the polyimide sheet 46, the provision of the hole portions 9A in the pressing tool 9 may be omitted. From such a structure, the same effect as obtained when the hole portions 9A are provided in the pressing tool 9 is also obtainable.

Figure 32:
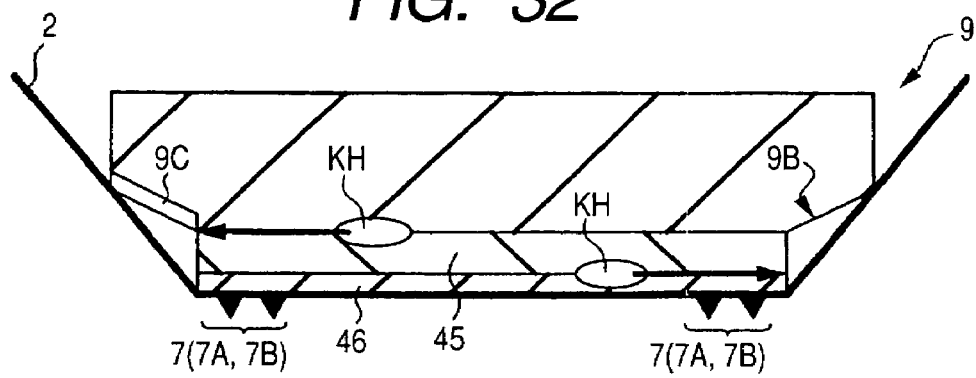
FIG. 32 is a main-portion cross-sectional view illustrating a chamfering process performed with respect to the outer peripheral sharp-edge portion of the main surface of the pressing tool for forming the probe card according to the first embodiment.

As shown in FIG. 32, a chamfered portion 9B may also be formed by performing a chamfering process with respect to the sharp-edge portion around the entire outer periphery (first outer periphery) of the main surface of the pressing tool 9 opposing the elastomer 45, the polyimide sheet 46, and the thin-film sheet 2. In this case, the 2D size of each of the elastomer 45 and the polyimide sheet 46 is adjusted to be smaller than that of the pressing tool 9. FIG. 32 shows a main-portion cross section when the surface of the chamfered portion 9B is flat. In the case where such a chamfering process has not been performed, a stress is concentrated on each of the respective portions of the elastomer 45, the polyimide sheet 46, and the thin-film sheet 2 which come in direct or indirect contact with the outer peripheral sharp-edge portion of the main surface of the pressing tool 9 as a result of pressing by the pressing tool 9. In the first embodiment, such stress concentration can be reduced by performing the chamfering process described above. As a result, it becomes possible to remove the above-mentioned gas bubbles KH from the respective side surfaces (a second outer peripheral portion, a third outer peripheral portion) of the pressing tool 9, the elastomer 45, and the polyimide sheet 46 through the individual interfaces therebetween (a first contact surface, a second contact surface) under the chamfered portion 9B.

Figure 33:
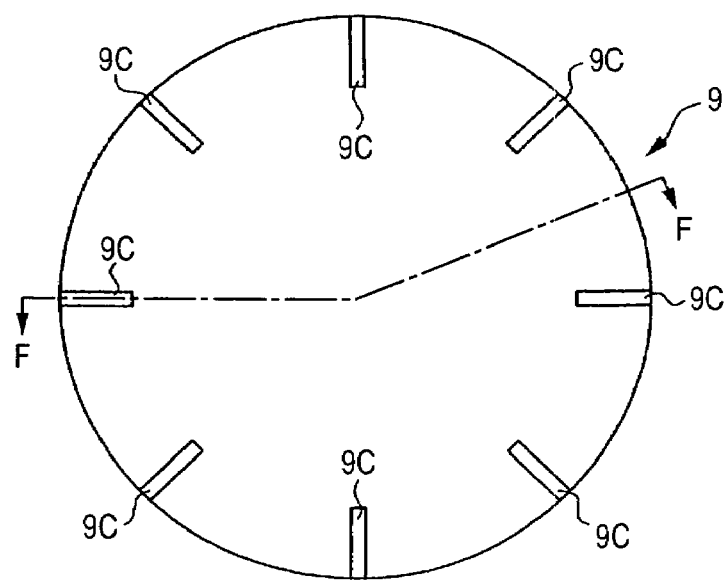
FIG. 33 is a plan view of the main surface of the pressing tool for forming the probe card according to the first embodiment.

It is also possible to form at least one trenched portion 9C in the outer periphery of the main surface of the pressing tool 9 formed with the chamfered portion 9B (see also FIG. 33). FIG. 33 is a plan view of the main surface of the pressing tool 9 formed with the trenched portions 9C. The cross section of the pressing tool 9 in FIG. 32 corresponds to a cross section taken along the line F-F in FIG. 33. Under such trenched portions 9C, the concentration of a stress on the elastomer 45, the polyimide sheet 46, and the thin-film sheet 2 can further be prevented. In other words, the gas bubbles KH mentioned above can be removed more effectively under the trenched portions 9C.

Even when at least one of the hole portions 9A, THL, and THLC is not formed, the formation of the chamfered portion 9B or the trenched portion 9C allows the removal of the gas bubbles KH from each of the side surfaces of the pressing tool 9, the elastomer 45, and the polyimide sheet 46 through each of the interfaces therebetween under the chamfered portion 9B or the trenched portion 9C, though the degree of the effect achieved by the removal of the gas bubbles differs.

Figure 34:
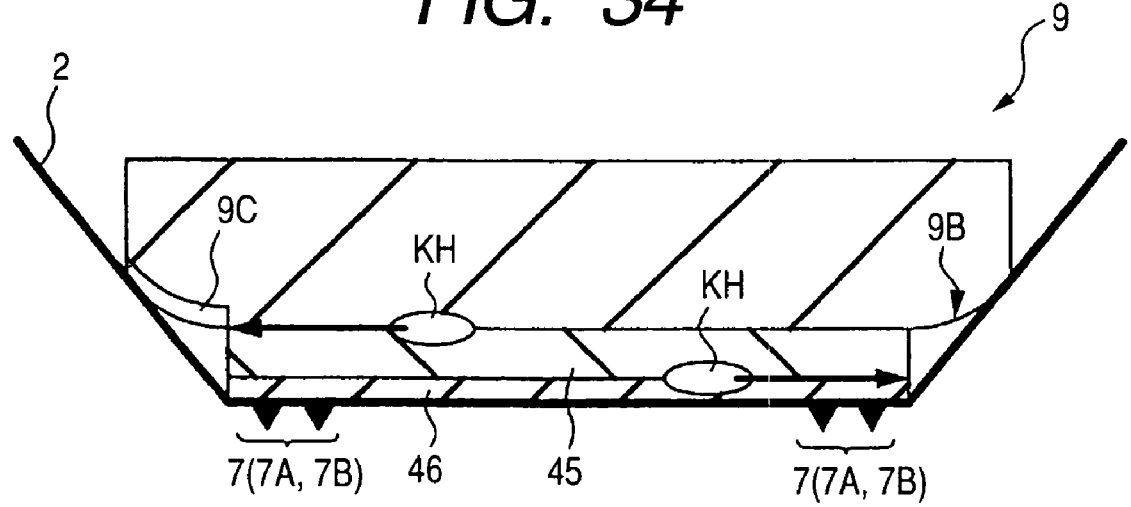
FIG. 34 is a main-portion cross-sectional view illustrating a chamfering process performed with respect to the outer peripheral sharp-edge portion of the main surface of the pressing tool for forming the probe card according to the first embodiment.

Although FIG. 32 shows the chamfered portion 9B having a flat surface, the chamfered portion 9B may also has a curved (round-tapered) surface, as shown in FIG. 34.

Embodiment 2

In contrast to the first embodiment which has illustrated the case where the thin-film sheet 2 has the single wiring layer formed therein (see, e.g., FIG. 24), the thin-film sheet 2 according to the second embodiment of the present invention has a plurality of wiring layers.

Figure 35:
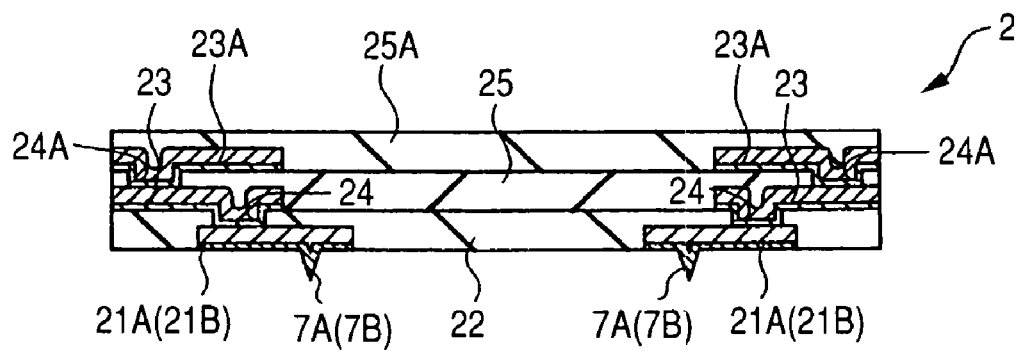
FIG. 35 is a main-portion cross-sectional view of a thin-film sheet for forming a probe card according to a second embodiment of the present invention.

FIG. 35 is a main-portion cross-sectional view of the thin-film sheet 2 according to the second embodiment. As shown in FIG. 35, the thin-film sheet 2 according to the second embodiment has a multilayer wiring structure in which wires 23A and a polyimide film 25A are formed over the wires 23 and the polyimide film 25. The wires 23A are connected to the wires 23 in through holes 24A formed in the polyimide film 25. Although FIG. 35 illustrates the case where the two wiring layers are formed, more multiple wiring layers may also be formed.

Figure 36:
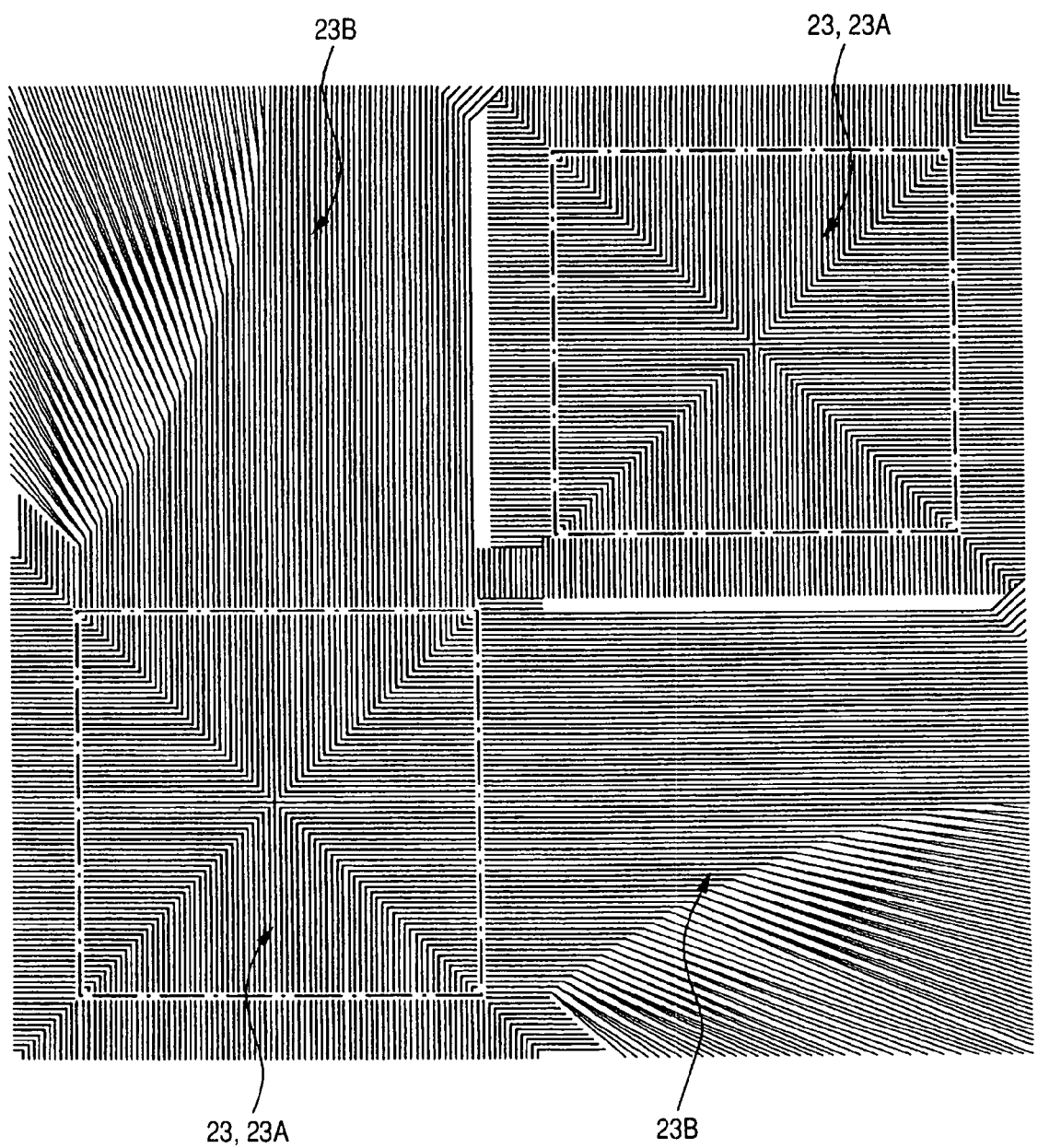
FIG. 36 is a main-portion plan view showing the main-portion 2D layout of wiring layers in the thin-film sheet for forming the probe card according to the second embodiment.

In the second embodiment, the wiring density (wire-to-wire spacing) is equalized particularly in the vicinity of the probes 7 (7A, 7B) in the thin-film sheet 2. FIG. 36 shows the main-portion 2D layout of the wiring layer having the wires 23 or the wires 23A formed in the thin-film sheet 2. In FIG. 36, the regions enclosed by the dash-dot squares correspond to the outer configurations of the chips 10 as testing targets. By way of example, the wires 23 or 23A electrically connected to the probes 7 are formed in the regions enclosed by the dash-dot squares. FIG. 36 illustrates the layout when the probes 7 formed on the probe card are brought into contact with the two chips 10 (see FIGS. 6 and 12) by a single contact with the wafer WH (see FIG. 5) as a testing target. In this case, the two chip regions 10 adjoin each other in the direction in which the respective diagonals thereof extend. In regions adjacent to the regions enclosed by the dash-dot squares, wires (third wires) 23B which are electrically unconnected to the probes 7 are arranged with a density equal to the density with which the wires 23 or 23A are arranged. Such wires 23B can be formed from the same wiring layer from which the wires 23 or 23A are formed simultaneously therewith. By arranging such wires 23B, it becomes possible to equalize the wiring density particularly in the vicinity of the probes 7 in the thin-film sheet 2 and equalize the rigidity of the thin-film sheet 2. This can prevent the local concentration of a stress resulting from a temperature change during probe testing and thereby prevent the problem of the unequal heights of the tips of the probes 7. As a result, all the probes 7 can reliably contact the corresponding pads 11 and 12 (see FIGS. 6 and 12) during probe testing.

Figure 37:
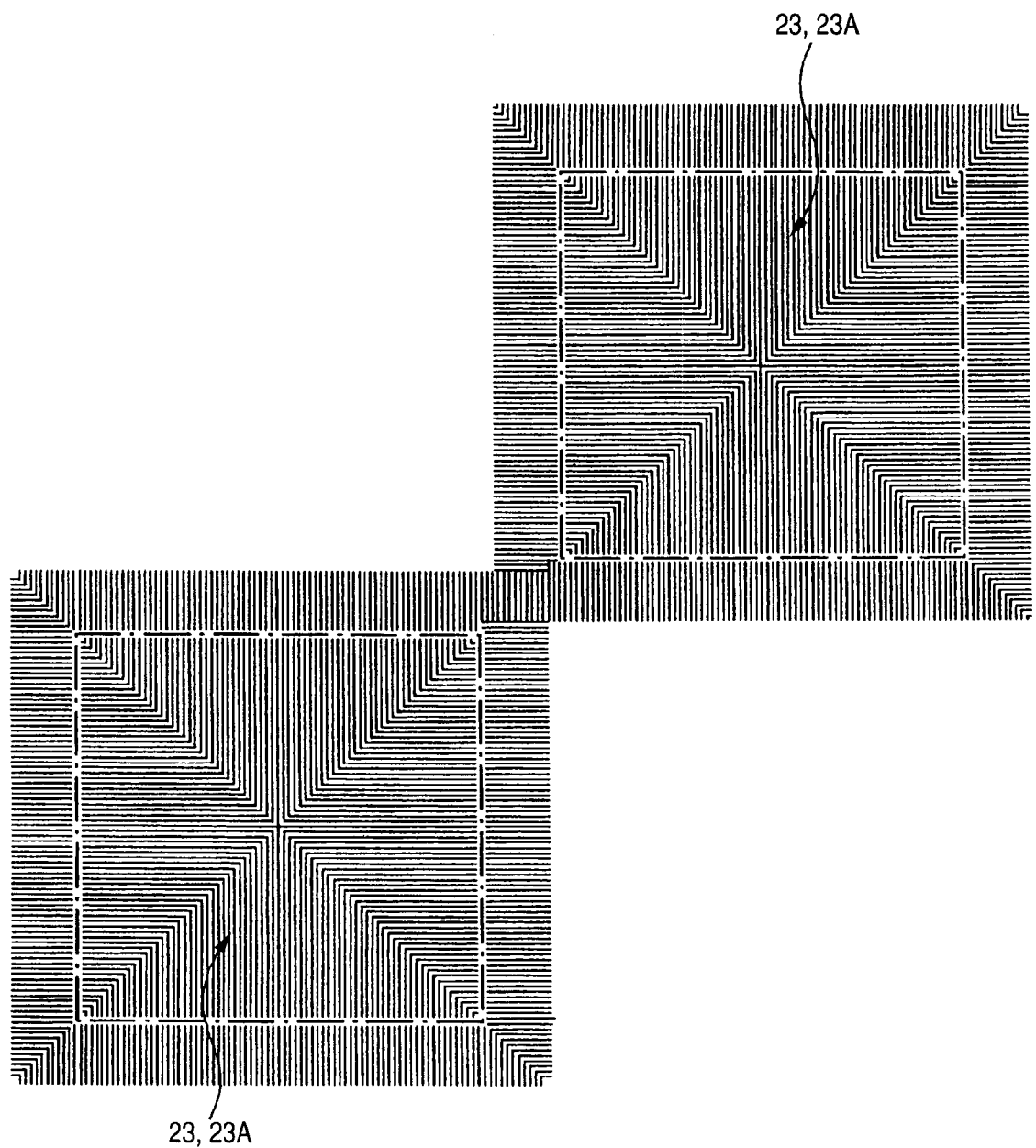
FIG. 37 is a main-portion plan view showing the main-portion 2D layout of wiring layers in a thin-film sheet in comparison with the main-portion 2D layout of the wiring layers in the thin-film sheet shown in FIG. 36.

In the case where the provision of the wires 23B is omitted as shown in FIG. 37, the wiring density and the rigidity in the vicinity of the probes 7 are unequal. As a result, the problem of local stress concentration may occur in the thin-film sheet 2 due to a temperature change during probe testing and, consequently, the problem of the unequal heights of the tips of the probes 7 may also occur.

Figure 38:
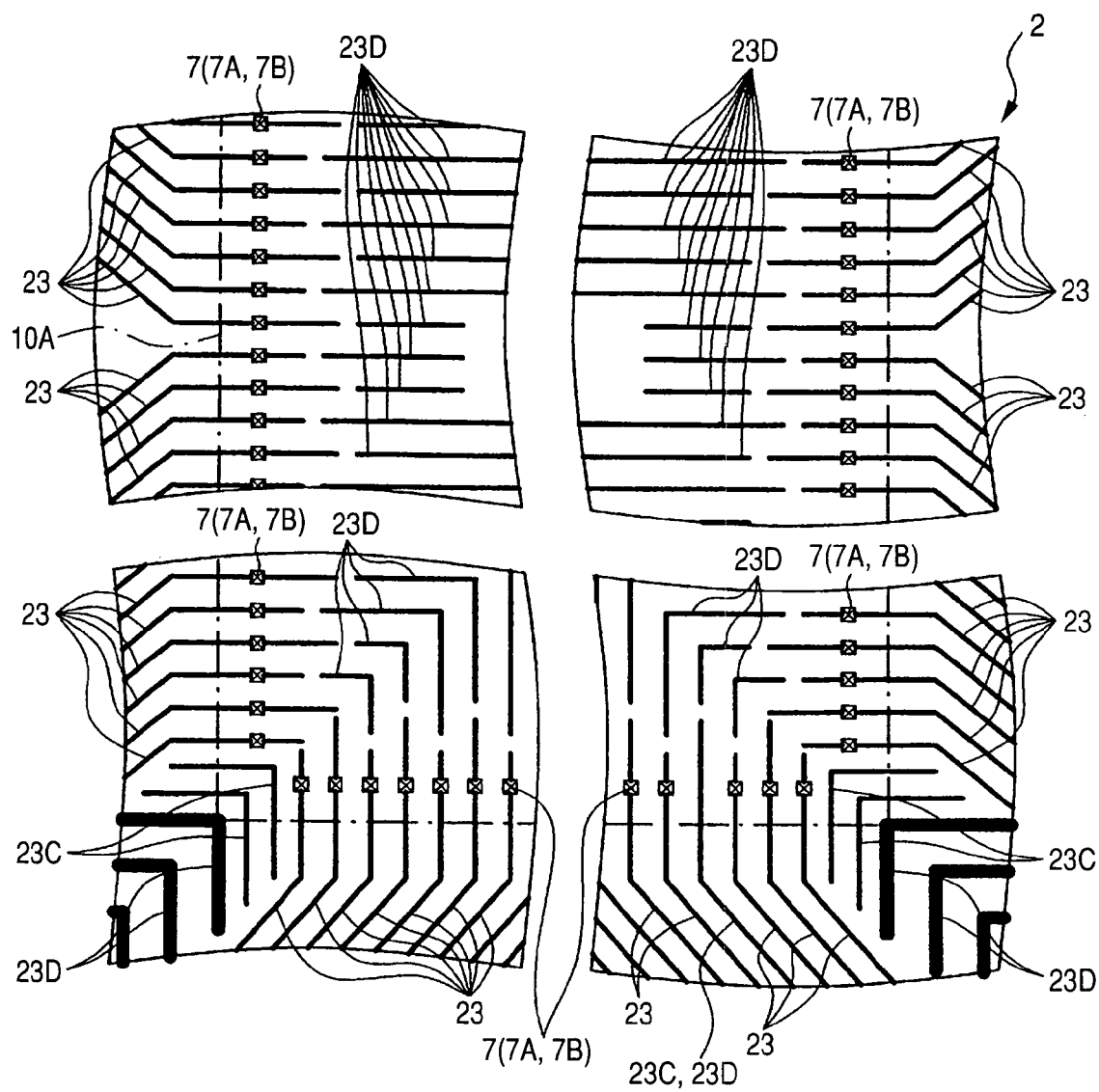
FIG. 38 is a main-portion plan view showing the main-portion 2D layout of wiring layers in a thin-film sheet for forming the probe card according to the second embodiment.
Figure 39:
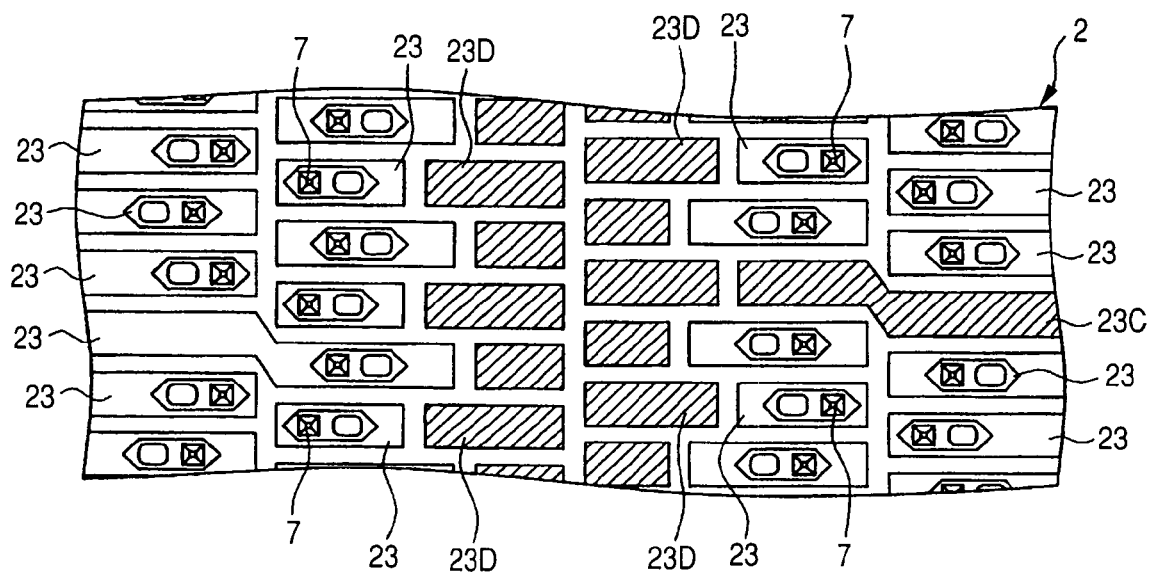
FIG. 39 is a main-portion plan view showing the main-portion 2D layout of a first wiring layer in the thin-film sheet for forming the probe card according to the second embodiment.
Figure 40:
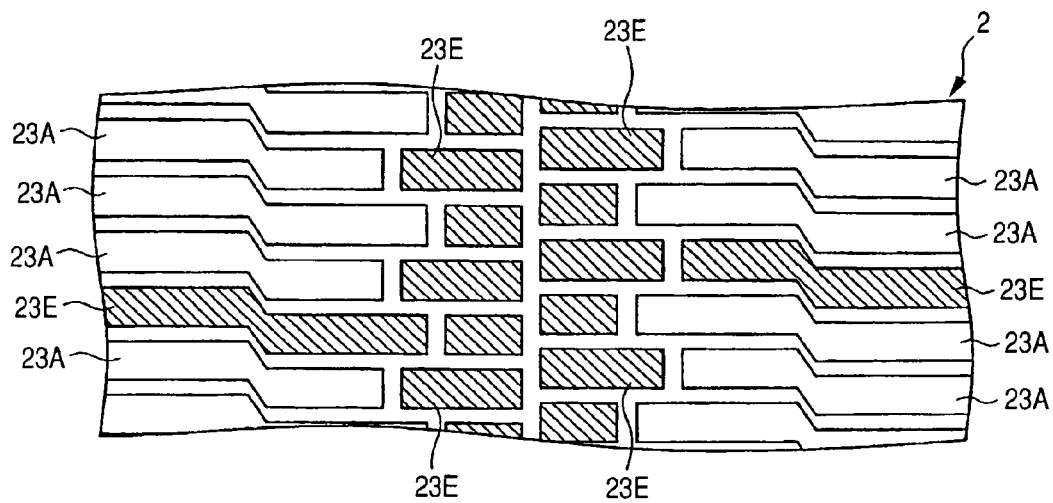
FIG. 40 is a main-portion plan view showing the main-portion 2D layout of a second wiring layer in the thin-film sheet for forming the probe card according to the second embodiment.
Figure 41:
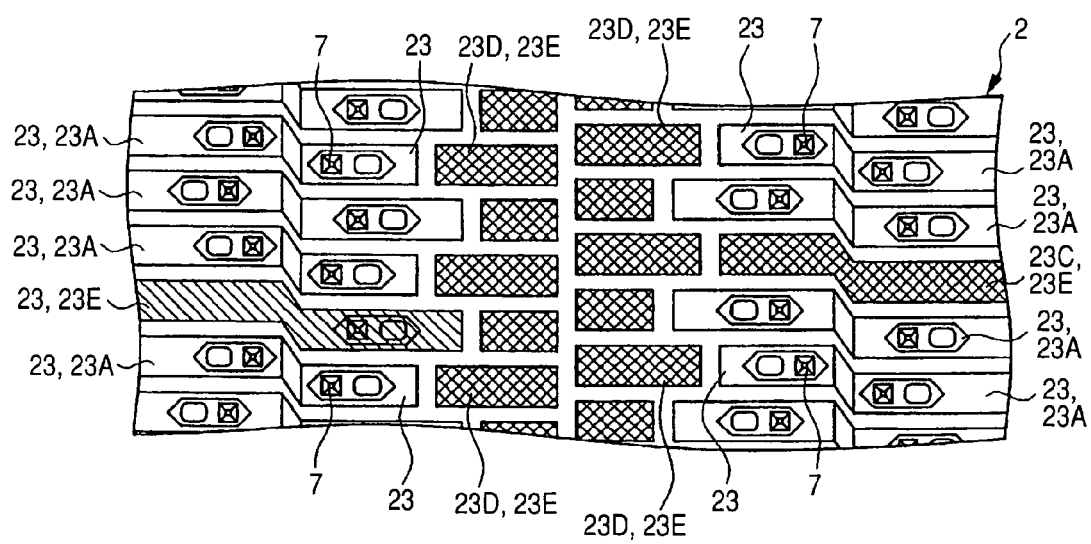
FIG. 41 is a main-portion plan view of a combination of the 2D layout of FIG. 39 and the 2D layout of FIG. 40.

Wires which are electrically unconnected to the probes 7 may also be placed even in the regions enclosed by the dash-dot squares in FIG. 36. FIG. 38 shows the main portion of the schematic 2D layout of the wires in the first layer including the wires 23 in the vicinity of the probes 7. FIG. 39 shows the main portion of the 2D layout of FIG. 38 in enlarged relation. FIG. 40 shows the 2D layout of the wires in the second layer including the wires 23A at the position corresponding to FIG. 39. FIG. 41 is a combination of the 2D layouts shown in FIGS. 39 and 40. The regions enclosed by the dash-dot squares in FIG. 38 are regions 10A corresponding to the outer configurations of the chips 10 as testing targets.

As shown in FIG. 38, the second embodiment places wires (third wires) 23C which are electrically unconnected to the probes 7 (7A, 7B) in portions where the spacings between the wires 23 are wider (the wiring density of the wires 23 is lower) and in the regions 10A where the wires 23 are not placed. In the case where such wires 23C are not placed, the portions of the thin-film sheet 2 in which the wires 23 and 23C are not placed are thinned and the problem of the degraded contact property of the probes 7 with respect to the pads 11 and 12 may occur. However, since the second embodiment has placed the wires 23C, the unequal thickness of the thin-film sheet 2 can be prevented and the degraded contact property of the probes 7 with respect to the pads 11 and 12 can also be prevented.

In addition, wires (third wires) 23D which are electrically unconnected to the probes 7 are also placed in the portions of the region 10A inner than the wires 23 and 23C and in the portions outside the region 10A where the spacings between the wires 23 are wider (the wiring density of the wires is lower). In the case where such wires 23D are not placed, the rigidity of each the portions of the thin-film sheet 2 in which the wires 23, 23C, and 23D are not placed lowers so that local stress concentration occurs in the thin-film sheet 2 due to a temperature change during probe testing. As a result, the problem of the unequal heights of the tips of the probes 7 may occur. However, since the second embodiment has placed the wires 23D, the rigidity of the thin-film sheet 2 can be equalized. This can prevent local stress concentration in the thin-film sheet 2 due to a temperature change during probe testing and can prevent the degraded contact property of the probes 7 with respect to the pads 11 and 12.

As shown in FIGS. 39 to 41, a layout for the wires in the second layer including the wires 23B is formed in accordance with the layout for the wires 23, 23C, and 23D in the first layer. In FIGS. 39 to 41, the wires 23C and 23D are shown with a 45° hatching and wires 23E are shown with a 135° hatching so that the 45° hatching and the 135° hatching overlap in the portions where the wires 23C and 23D and the wires 23E overlap. At this time, when the wires 23B are not placed at the positions corresponding to the wires 23, 23C and 23D in the lower layer, the wires (third wires) 23E which are electrically unconnected to the probes 7 are placed at the positions corresponding to the wires 23, 23C and 23D. As a result, it becomes possible to equalize the spacing (wiring density) between the wires including the wires 23B and 23E also in the second layer. That is, since the wiring pattern is formed such that the thin-film sheet 2 is not locally thinned also in the second wiring layer and the rigidity of the thin-film sheet 2 is equalized, the degraded contact property of the probes 7 with respect to the pads 11 and 12 can be prevented even when the multiple wiring layers are formed in the thin-film sheet 2. Even when more multiple wiring layers are formed in the thin-film sheet 2, the degraded contact property of the probes 7 with respect to the pads 11 and 12 can be prevented by forming the same wiring pattern as for the wires 23B and 23E.

Figure 42:
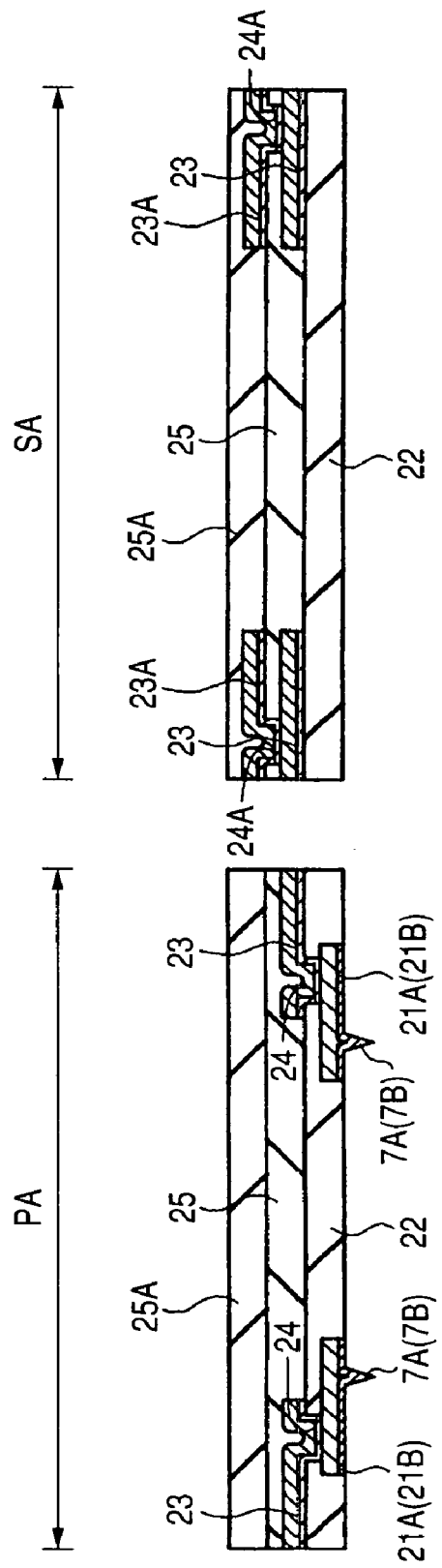
FIG. 42 is a main-portion cross-sectional view of a thin-film sheet for forming the probe card according to the second embodiment.

When there are differences between the respective heights of the tips of the probes 7 (7A, 7B) and all the probes 7 cannot contact the pads 11 and 12 during probe testing, all the probes 7 can be brought into contact with the pads 11 and 12 by increasing an amount of overdrive for the probe card. However, the increased amount of overdrive increases the load imposed by the probes 7 on the chips 10 and may cause the breakdown of the circuits and elements formed in the chips 10. To prevent such a problem, the second embodiment can illustrate the structure in which only one wiring layer (wires 23) is placed over the probes 7 (7A, 7B) and the adjacent region PA thereof in the thin-film sheet 2, while a plurality of wiring layers (wires 23, 23A) are placed in the other region SA therein, as shown in FIG. 42. This allows the rigidity of the thin-film sheet 2 to be lower in the region PA than in the other region SA. As a result, it becomes possible to bring all the probes 7 into contact with the pads 11 and 12 even under a low load, i.e., with a low amount of overdrive and thereby prevent the breakdown of the circuits and the elements formed in the chips 10 during probe testing.

Figure 43:
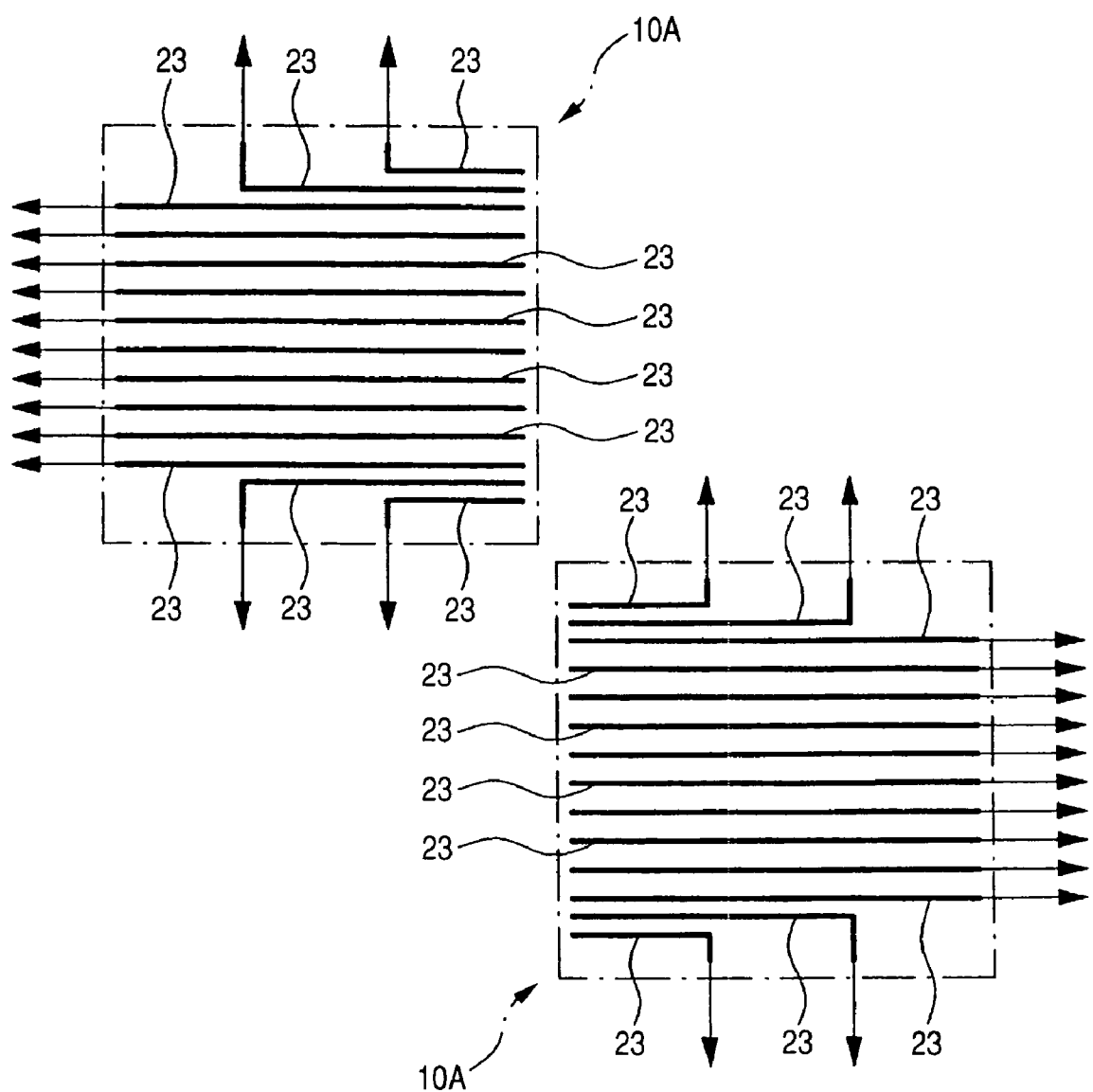
FIG. 43 is a view illustrating the direction in which a wiring pattern extends in the thin-film sheet for forming the probe card according to the second embodiment.

As described above with reference to FIG. 36, the two chip regions 10 (corresponding to the regions 10A of the thin-film sheet 2) which are subjected to probe testing by a single contact with the probes (7A, 7B) adjoin each other in the direction in which the respective diagonals thereof extend in the second embodiment. Accordingly, the extending directions of the wires 23 extracted from the two regions 10A adjoining in the direction in which the respective diagonals thereof extend do not intersect, as shown in FIG. 43. Thus, according to the second embodiment, the wires 23 forming the first wiring layer are allowed to extend without intersecting the other wires 23 even outside the regions 10A. This can increase the flexibility with which the wires 23 are routed (placement layout). As a result, a wiring layout can be formed without increasing the number of wiring layers in the region PA shown in FIG. 42 to two or more. Therefore, the rigidity of the thin-film sheet 2 can be adjusted to be lower in the region PA than in the other region SA (see FIG. 42).

Figure 44:
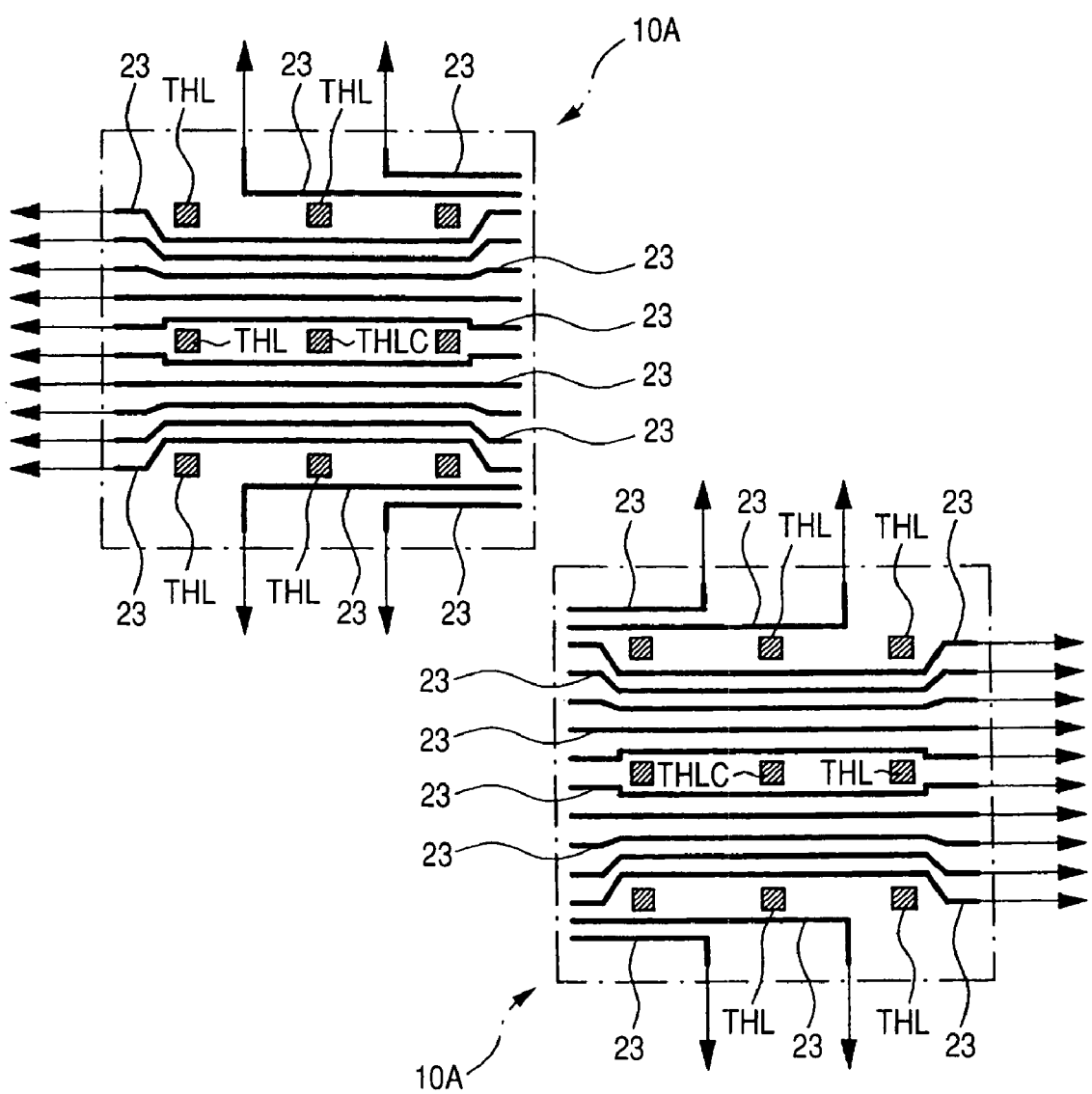
FIG. 44 is a view illustrating a wiring pattern in comparison with the wiring pattern in the thin-film sheet according to the second embodiment shown in FIG. 43.
Figure 45:
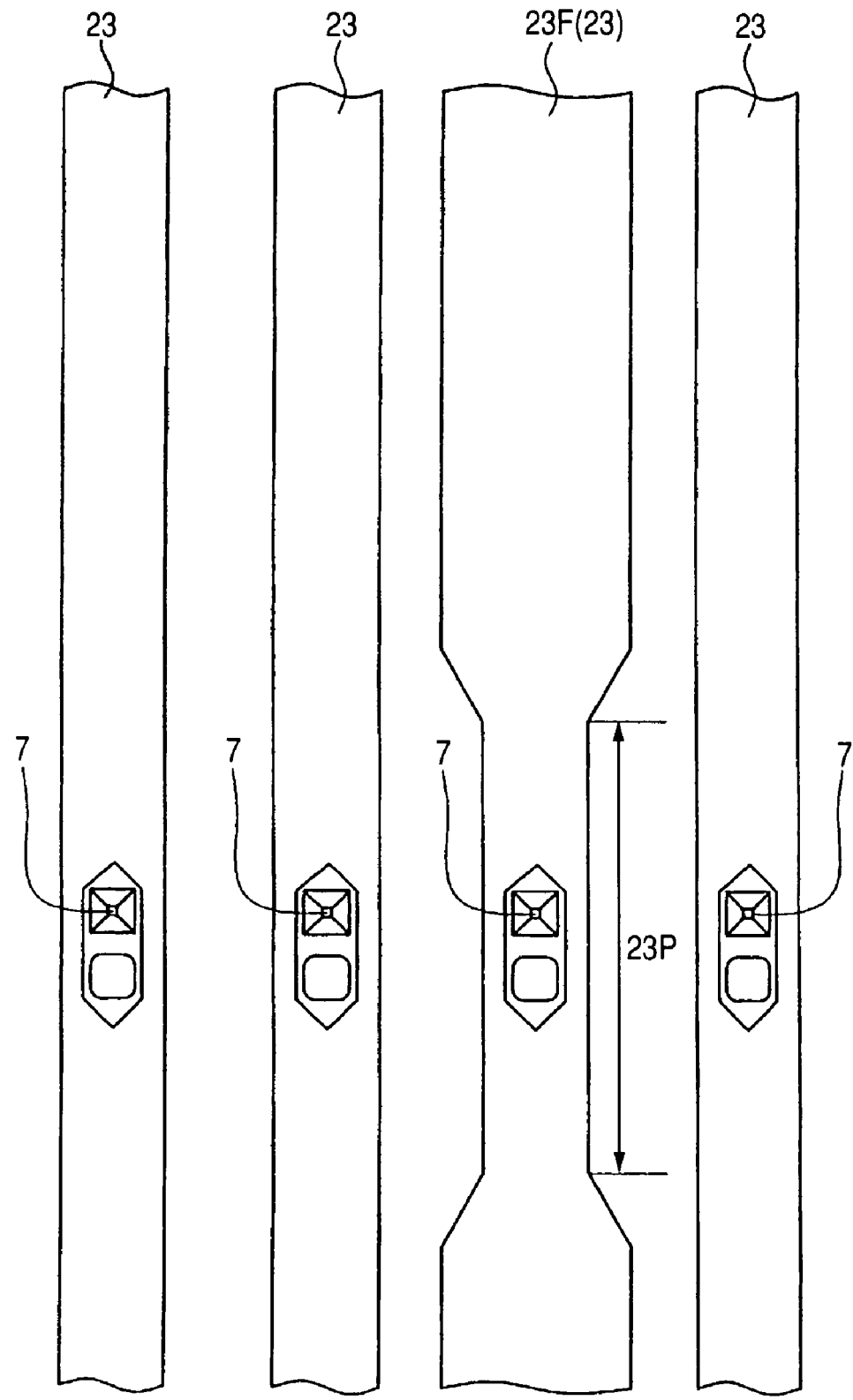
FIG. 45 is a main-portion plan view illustrating the wiring pattern in the thin-film sheet for forming the probe card according to the second embodiment.

In the case where the hole portions THL and THLC (see FIGS. 27 and 31) described in the first embodiment are not formed in the thin-film sheet 2, the flexibility with which the wires 23 are routed (placement layout) can be increased also in the regions 10A (see FIG. 43). In the case where the hole portions THL and THLC are formed, on the other hand, a wiring layout should be formed such that the wires 23 are routed to avoid the hole portions THL and THLC. As a result, the flexibility with which the wires 23 are routed (placement layout) in the regions 10A lowers and it becomes difficult to extensively route the wires 23 (see FIG. 44). Thus, in the case where the hole portions THL and THLC are not formed in the thin-film sheet 2, it is possible to easily form the placement layout for the wires 23 described above with reference to FIG. 43, in which the extending directions of the wires 23 do not intersect.

Of the wires 23, a wire 23F electrically connected to the probe 7 for contact with the pad 11 or 12 in a power source system allows a larger current to flow therethrough than currents allowed to flow through the other wires 23 during probe testing so that the wire 23F is formed to have a larger width than the other wires 23. As a result, the rigidity of the thin-film sheet 2 is higher in the region thereof formed with the wire 23F and a situation may occur in which the probe 7 placed under the wire 23F and electrically connected thereto cannot contact the corresponding pad 11 or 12 during probe testing. To prevent this, the second embodiment adjusts the width of the portion the wire 23F which is placed over the probe 7 and in the vicinity region 23P thereof such that it is equal to the width of each of the other wires 23. This allows the rigidity of the thin-film sheet 2 in the region 23P to be equal to that in the region in which the other wires 23 are placed, while suppressing an increase in the resistance values of the wires 23F. As a result, even the probe 7 placed under the wire 23F and electrically connected thereto can reliably contact the corresponding pad 11 or 12 during probe testing.

Embodiment 3

Figure 46:
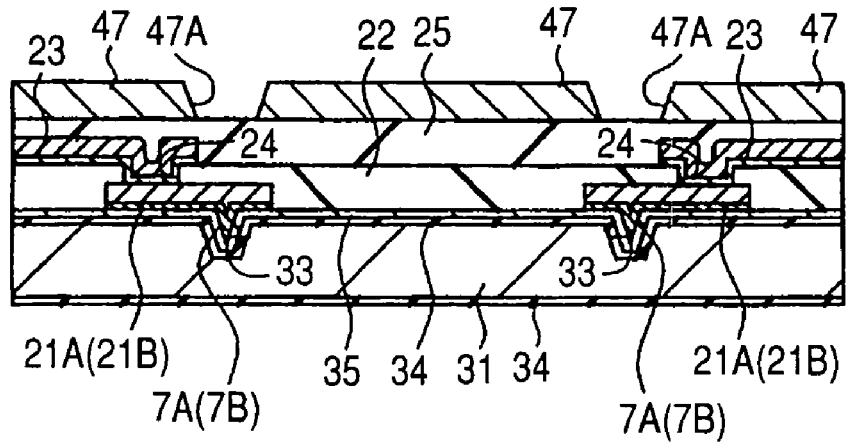
FIG. 46 is a main-portion cross-sectional view illustrating the step of manufacturing a thin-film sheet for forming a probe card according to a third embodiment of the present invention and also illustrating the structure thereof.
Figure 47:
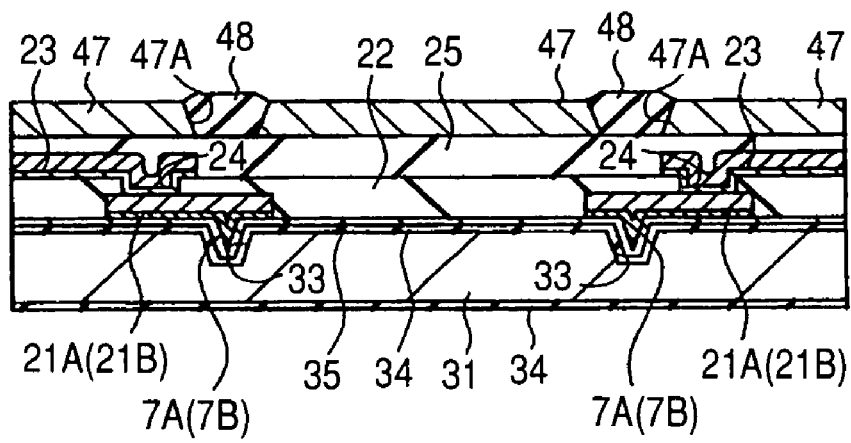
FIG. 47 is main-portion cross-sectional view of the thin-film sheet in the manufacturing step thereof subsequent to that illustrated in FIG. 46.
Figure 48:
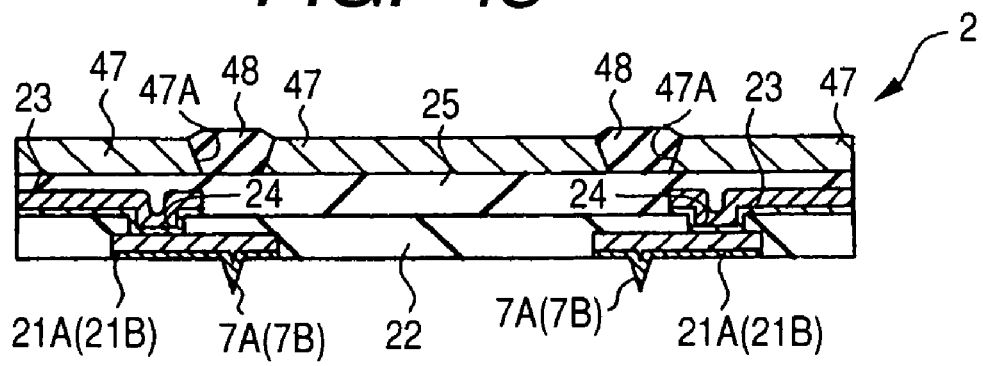
FIG. 48 is main-portion cross-sectional view of the thin-film sheet in the manufacturing step thereof subsequent to that illustrated in FIG. 47.

FIGS. 46 to 48 are main-portion cross-sectional views illustrating the manufacturing steps and structure of the thin-film sheet 2 according to the third embodiment of the present invention.

The manufacturing steps of the thin-film sheet 2 according to the third embodiment are the same as those according to the first embodiment up to the steps described with reference to FIGS. 19 to 23. Thereafter, a metal sheet (second sheet) 47 is fastened to the upper surface (the back surface (second back surface) opposite to the main surface (second main surface) formed with the probes 7A and 7B) of the polyimide film 25, as shown in FIG. 46. For the metal sheet 47, a material having a low linear expansion coefficient close to the linear expansion coefficient of the wafer 31 made of silicon is selected. For example, the third embodiment can show 42 alloy (alloy containing 42% nickel and 58% iron and having a linear expansion coefficient of 4 ppm/° C.) or Invar (alloy containing 36% nickel and 64% iron and having a linear expansion coefficient of 1.5 ppm/° C.). Instead of using the metal sheet 47, a silicon film made of the same material as composing the wafer 31 may also be formed. Otherwise, a material having the same linear expansion coefficient as silicon, e.g., a nickel-cobalt alloy or a mixed material of ceramic and resin may also be used. The fastening of the metal sheet 47 can be effected by superposing the metal sheet 47 on the main surface of the wafer 31 in registration therewith and performing heating at a temperature not less than the glass transition point temperature of the polyimide film 25, while applying pressure at about 10 to 200 kgf/cm², to thermo-compressively bonding the metal sheet 47 to the wafer 31.

By fastening the metal sheet 47 using the polyimide film 25, the strength of the thin-film sheet 2 to be formed can be increased. By fastening the metal sheet 47, the amounts of expansion or contraction of the thin-film sheet 2 and the wafer WH (see FIG. 5) as a testing target resulting from a temperature during probe testing can be equalized. As a result, it becomes possible to prevent the relative displacement between the probes 7A and 7B and the corresponding pads 11 (see FIGS. 6 and 12). In other words, it becomes possible to constantly maintain electrical contact between the probes 7A and 7B and the corresponding pads 11 irrespective of the temperature during probe testing. It also becomes possible to allow the high-accuracy positioning of the thin-film sheet 2 and the wafer WH as a testing target relative to each other in various situations.

Next, the metal sheet 47 is etched by using a photoresist film patterned by a photolithographic technique as a mask so that openings 47A are formed in the metal sheet 47 over the probes 7A and 7B. In the third embodiment, the etching may be spray etching using a ferric chloride solution.

After the photoresist film mentioned above is removed, an elastomer 48 is formed in each of the openings 47A, as shown in FIG. 47. At this time, the elastomer 48 is formed such that a prescribed amount thereof protrudes upward from the opening 47A. As an exemplary method of forming the elastomer 48, the third embodiment can show a method which applies an elastic resin into the opening 47A by print coating or dispenser coating or a method which disposes a silicon sheet. The elastomer 48 reduces an impact when the tips of the large number probes 7A and 7B come into contact with the pads 11, while accommodating variations in the heights of the tips of the individual probes 7A and 7B through local deformation, and thereby achieves contact between the probes 7A and 7B and the pads 11 by evenly jamming the tip portions of the probes 7A and 7B into the pads 11 despite the variations in the heights of the pads 11.

Thereafter, the thin-film sheet 2 according to the third embodiment is manufactured through the process step described in the first embodiment with reference to FIG. 24 (see FIG. 48).

When the thin-film sheet 2 according to the third embodiment manufactured by the process steps described above is attached to the probe card, the formation of the elastomer 45 and the polyimide sheet 46 used in the first embodiment is omitted. The constitutions and structures of the members composing the probe card other than the thin-film sheet 2 are the same as in the first embodiment.

When the thin-film sheet 2 according to the third embodiment is attached to the probe card, the elastomer 48 as one of the members composing the thin-film sheet 2 comes in contact with the pressing tool 9. As a result, a gap is formed between the metal sheet 47 and the pressing tool 9. Since the gap is thus formed, a stress is applied to the metal sheet 47 as a result of a temperature change during probe testing so that the metal sheet 47 warps. The warping of the metal sheet 47 entails the warping of the thin-film sheet 2 and the problem that the probes 7 (7A, 7B) cannot reliably contact the pads 11 (see FIGS. 6 and 12) of the chips 10 (see FIGS. 6 and 12) may occur.

Figure 49:
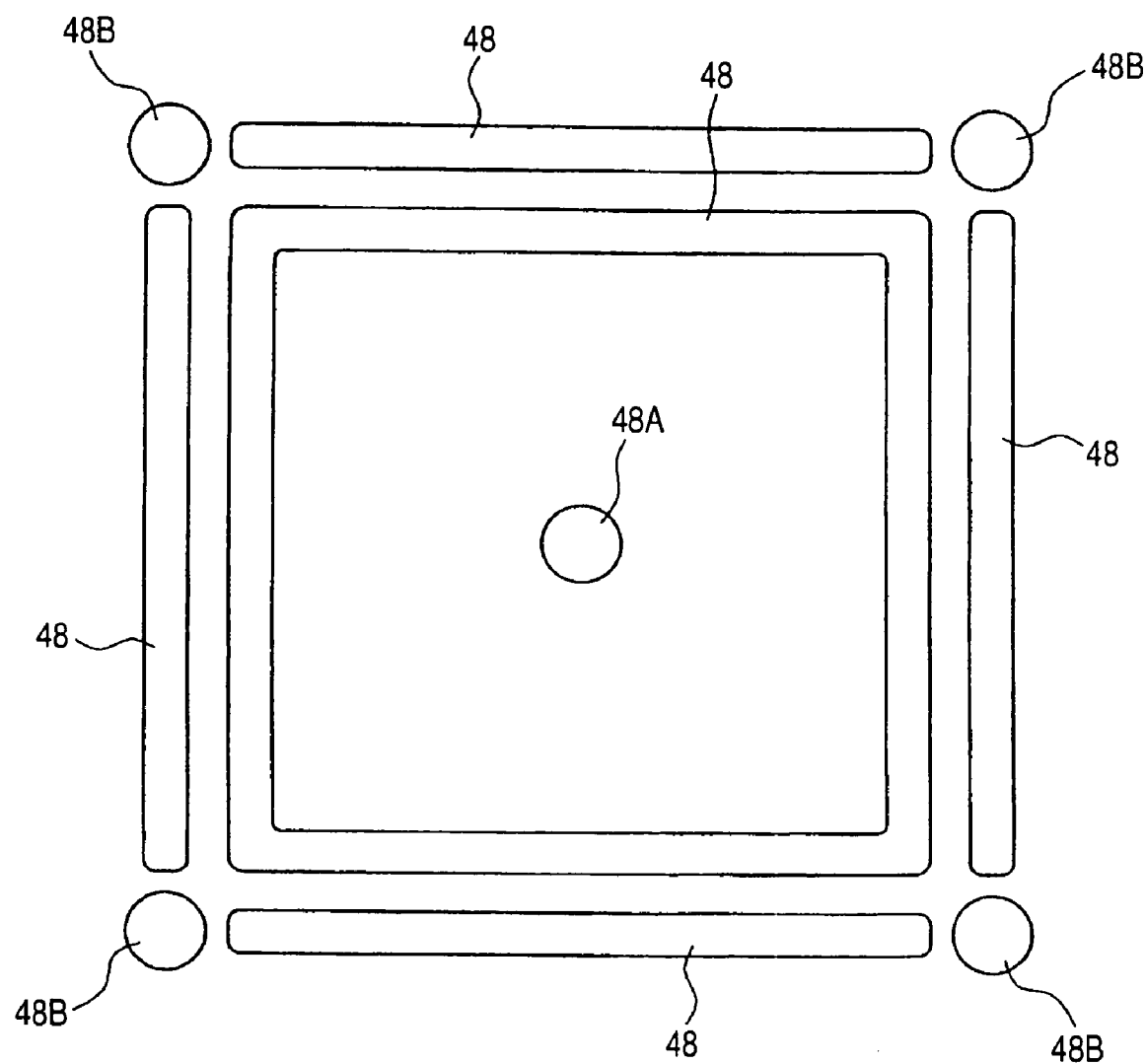
FIG. 49 is a main-portion plan view illustrating a pattern of an elastomer provided in the thin-film sheet for forming the probe card according to the third embodiment.

To prevent this, the third embodiment disposes an elastomer 48A having a circular plan configuration at the portion in which the above-mentioned gap is formed on a large scale, i.e., at the position where the metal sheet 47 occupies a large area in plan view. The elastomer 48A can be formed in the same process step as the elastomer 48. The pattern for the elastomer 48A is not limited to the circular plan configuration. For example, the pattern for the elastomer 48A may also be a rectangle in plan view. FIG. 49 shows the 2D pattern of the elastomers 48 and 48A. The position at which the elastomer 48A is placed can be located, e.g., in the region 10A shown in FIG. 27 according to the first embodiment, particularly in the vicinity of the center of the region 10A. By thus placing the elastomer 48A, the elastomer 48A supports the metal sheet 47 in the gap so that it becomes possible to prevent the warping of the metal sheet 47 resulting from a temperature change during probe testing. This allows the probes 7 (7A, 7B) to reliably contact the pads 11 of the chips 10 during probe testing.

Because the 2D pattern of the elastomer 48 is generally rectangular, a stress is concentrated on each of the corner portions of the generally rectangular pattern. This may cause the undesirable warping of the metal sheet 47. To prevent this, the third embodiment can illustrate an example in which an elastomer 48B similar to the elastomer 48A is also disposed at each of the corner portions. As a result, the warping of the metal sheet 47 can be prevented.

Figure 50:
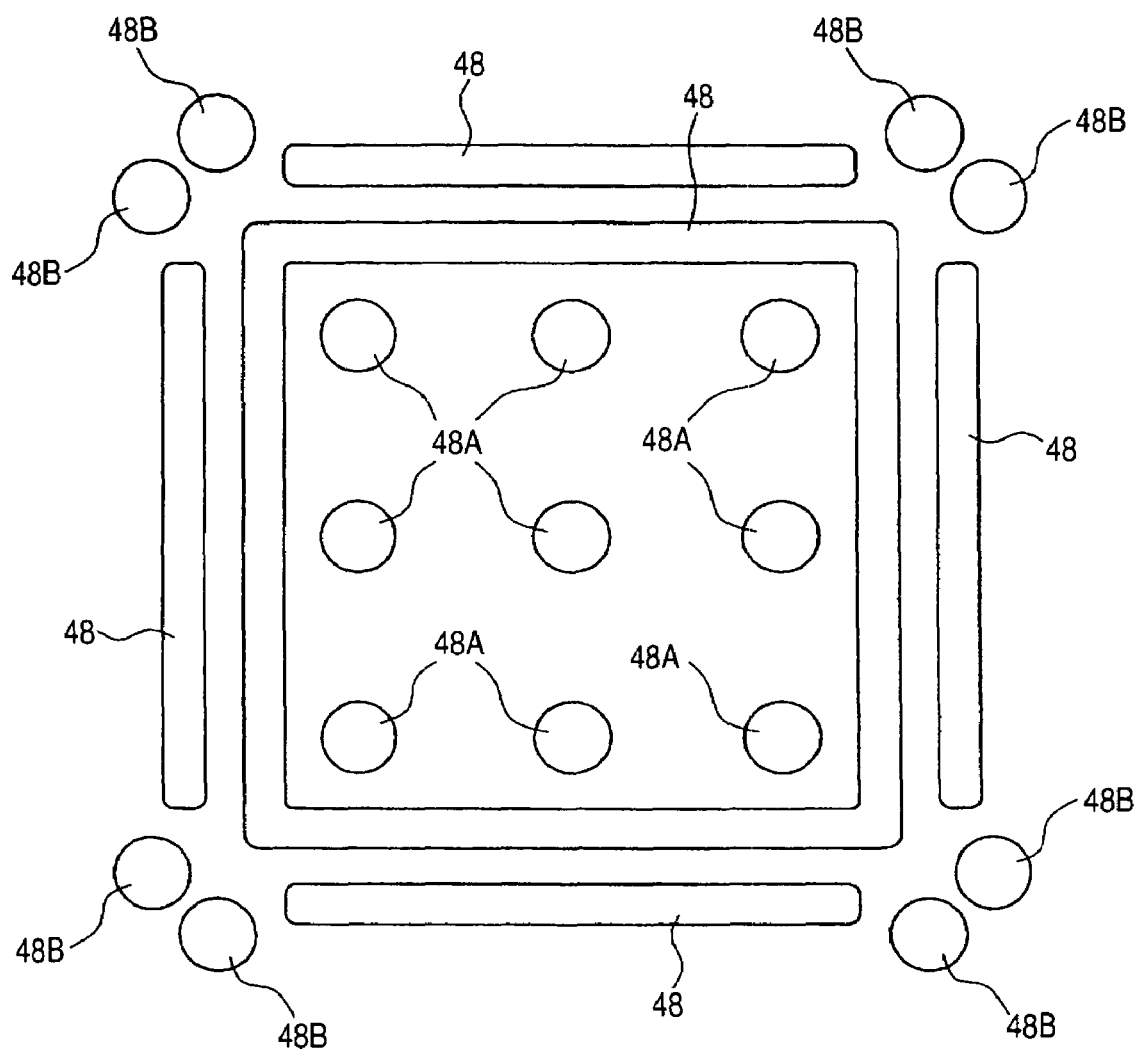
FIG. 50 is a main-portion plan view illustrating a pattern of the elastomer provided in the thin-film sheet for forming the probe card according to the third embodiment.

As shown in FIG. 50, a plurality of the foregoing elastomers 48A and 48B may also be placed. As a result, the warping of the metal sheet 47 can be prevented more effectively than in the case using the placement pattern shown in FIG. 49.

From the foregoing third embodiment also, the same effects obtained in the first and second embodiments are obtainable.

Although the invention achieved by the present inventors has thus been described specifically with reference to the embodiments thereof, the present invention is not limited thereto. It will be understood that various changes and modifications can be made in the invention without departing from the gist thereof.

The manufacturing method of a semiconductor integrated circuit device according to the present invention is widely applicable to a probe testing step in the manufacturing process steps of the semiconductor integrated circuit device.

What is claimed is:

1. A manufacturing method of a semiconductor integrated circuit device, comprising the steps of:
   (a) preparing a semiconductor wafer partitioned into a plurality of chip regions in which individual semiconductor integrated circuits are formed, said semiconductor wafer having a plurality of first electrodes formed over a main surface thereof and electrically connected to said semiconductor integrated circuits;
   (b) preparing a first card comprising: a first wiring board which has first wires formed therein; a first sheet which has a plurality of contact terminals formed thereover for contact with said first electrodes and has a plurality of second wires formed therein and electrically connected to said contact terminals and to said first wires, said first sheet being held by said first wiring board such that said contact terminals have respective tips thereof opposing said main surface of said semiconductor wafer; and a pressing mechanism which has a first main surface opposing said first sheet, has a first back surface opposite to said first main surface, and has at least one first hole portion formed therein and extending therethrough from said first main surface to said first back surface, said pressing mechanism pressing, from a back surface side thereof, a first region of said first sheet which is formed with said contact terminals; and (c) performing electrical testing of said semiconductor integrated circuits by contacting said tips of said contact terminals with said first electrodes.

2. A manufacturing method according to claim 1, wherein impact reducing means for accommodating height differences between said respective tips of said contact terminals and accommodating height differences between respective surfaces of said first electrodes is disposed between said first sheet and said pressing mechanism.

3. A manufacturing method according to claim 2,
wherein said first main surface of said pressing mechanism includes a first outer peripheral portion processed to prevent concentration of a stress on said first outer peripheral portion,
wherein gas bubbles between said impact reducing means and said pressing means are removed from at least one of a second outer peripheral portion of a first contact surface between said impact reducing means and said pressing means and said first hole portion, and
wherein gas bubbles between said first sheet and said impact reducing means are removed from a third outer peripheral portion of a second contact surface between said first sheet and said impact reducing means.

4. A manufacturing method according to claim 3,
wherein said impact reducing means has at least one second hole portion formed therein and extending therethrough between main and back surfaces thereof, and
wherein said gas bubbles between said first sheet and said impact reducing means are removed from at least one of a path including said second hole portion and said third outer peripheral portion.

5. A manufacturing method according to claim 4, wherein said second hole portion is preliminarily formed by punching before said first card is assembled.

6. A manufacturing method according to claim 2, wherein said second wires are formed in a layout which prevents local concentration of a stress on said first sheet.

7. A manufacturing method according to claim 6, wherein said second wires are provided with equal coarseness or denseness in said first sheet.

8. A manufacturing method according to claim 7, wherein said second wires have equal widths, equal numbers of layers, and equal spacings therebetween in said first sheet.

9. A manufacturing method according to claim 6, wherein at least one third wire electrically unconnected to any of said contact terminals in the same wiring layer in which said second wires are provided is formed in said first sheet.

10. A manufacturing method according to claim 1,
wherein said first sheet has at least one third hole portion formed therein and extending through between main and back surfaces thereof, and
wherein gas bubbles between said first sheet and said pressing mechanism are removed from at least either of said first hole portion and said third hole portion.

11. A manufacturing method according to claim 10, wherein impact reducing means for accommodating height differences between said respective tips of said contact terminals and height differences between respective surfaces of said first electrodes is disposed between said first sheet and said pressing mechanism.

12. A manufacturing method according to claim 11,
wherein said impact reducing means has at least one second hole portion formed therein and extending therethrough between main and back surfaces thereof, and
wherein said second hole portion is preliminarily formed by punching before said first card is assembled.

13. A manufacturing method according to claim 11,
wherein said impact reducing means has at least one second hole portion formed therein and extending therethrough between main and back surfaces thereof, and
wherein a step of forming said second hole portion includes the steps of:
(b1) bonding said first sheet and said impact reducing means to each other before assembling said first card; and
(b2) after said step (b1), simultaneously forming said second and third hole portions.

14. A manufacturing method according to claim 13, wherein said second and third hole portions are formed by laser processing.

15. A manufacturing method according to claim 13,
wherein said first card is assembled after said second and third hole portions are formed, and
wherein said contact terminals have respective positions thereof adjusted after said first card is assembled.

16. A manufacturing method according to claim 10,
wherein said impact reducing means has at least one second hole portion formed therein and extending therethrough between main and back surfaces thereof,
wherein said first main surface of said pressing mechanism includes a first outer peripheral portion processed to prevent concentration of a stress on said outer peripheral portion,
wherein gas bubbles between said impact reducing means and said pressing mechanism are removed from a second outer peripheral portion of a first contact surface between said impact reducing means and said pressing mechanism, and
wherein gas bubbles between said first sheet and said impact reducing means are removed from a third outer peripheral portion of a second contact surface between said first sheet and said impact reducing means.

17. A manufacturing method of a semiconductor integrated circuit device, comprising the steps of:
(a) preparing a semiconductor wafer partitioned into a plurality of chip regions in which individual semiconductor integrated circuits are formed, said semiconductor wafer having a plurality of first electrodes formed over a main surface thereof and electrically connected to said semiconductor integrated circuits;
(b) preparing a first card comprising: a first wiring board which has first wires formed therein; a first sheet which has a plurality of contact terminals formed thereover for contact with said first electrodes and has a plurality of second wires formed therein and electrically connected to said contact terminals and to said first wires, said first sheet being held by said first wiring board such that said contact terminals have respective tips thereof opposing said main surface of said semiconductor wafer; and a pressing mechanism which has a first main surface opposing said first sheet and including a first outer peripheral portion processed to prevent concentration of a stress on said first outer peripheral portion, and has a first back surface opposite to said first main surface, said pressing mechanism pressing, from a back surface side thereof, a first region of said first sheet which is formed with said contact terminals; and
(c) performing electrical testing of said semiconductor integrated circuits by contacting said tips of said contact terminals with said first electrodes,
wherein gas bubbles between said first sheet and said pressing mechanism are removed from said outer peripheral portion of said first main surface of said pressing mechanism.

18. A manufacturing method of a semiconductor integrated circuit device, comprising the steps of:
   (a) preparing a semiconductor wafer partitioned into a plurality of chip regions in which individual semiconductor integrated circuits are formed, said semiconductor wafer having a plurality of first electrodes formed over a main surface thereof and electrically connected to said semiconductor integrated circuits;
   (b) preparing a first card comprising: a first wiring board which has first wires formed therein; a first sheet which has a plurality of contact terminals formed thereover for contact with said first electrodes and has a plurality of second wires formed therein and electrically connected to said contact terminals and to said first wires, said first sheet being held by said first wiring board such that said contact terminals have respective tips thereof opposing said main surface of said semiconductor wafer; and a pressing mechanism which has a first main surface opposing said first sheet and has a first back surface opposite to said first main surface, said pressing mechanism pressing, from a back surface side thereof, a first region of said first sheet which is formed with said contact terminals; and
   (c) performing electrical testing of said semiconductor integrated circuits by contacting said tips of said contact terminals with said first electrodes,
   wherein said second wires are provided with equal coarseness or denseness in a vicinity of said contact terminals in said first sheet.

19. A manufacturing method of a semiconductor integrated circuit device according to claim 18, wherein said second wires have equal widths, equal numbers of layers, and equal spacings therebetween in the vicinity of said contact terminals in said first sheet.

20. A manufacturing method according to claim 18, wherein at least one third wire electrically unconnected to any of said contact terminals in the same wiring layer in which said second wires are provided is formed in the vicinity of said contact terminals in said first sheet.

21. A manufacturing method of a semiconductor integrated circuit device, comprising the steps of:
   (a) preparing a semiconductor wafer partitioned into a plurality of chip regions in which individual semiconductor integrated circuits are formed, said semiconductor wafer having a plurality of first electrodes formed over a main surface thereof and electrically connected to said semiconductor integrated circuits;
   (b) preparing a first card comprising: a first wiring board which has first wires formed therein; a first sheet which has a plurality of contact terminals formed thereover for contact with said first electrodes and has a plurality of second wires formed therein and electrically connected to said contact terminals and to said first wires, said first sheet being held by said first wiring board such that said contact terminals have respective tips thereof opposing said main surface of said semiconductor wafer; and a pressing mechanism which has a first main surface opposing said first sheet and has a first back surface opposite to said first main surface, said pressing mechanism pressing, from a back surface side thereof, a first region of said first sheet which is formed with said contact terminals; and
   (c) performing electrical testing of said semiconductor integrated circuits by contacting said tips of said contact terminals with said first electrodes,
   wherein said second wires extracted from said contact terminals extend toward the outside of said first region in plan view and are placed in one layer in a vicinity of said contact terminals.

22. A manufacturing method according to claim 21,
   wherein in the step (c), said contact terminals come in contact with said first electrodes disposed in two of said chip regions, and
   wherein said two chip regions have respective rectangular plan configurations and adjoin each other in a direction in which each of respective diagonals thereof extends.

23. A manufacturing method of a semiconductor integrated circuit device, comprising the steps of:
   (a) preparing a semiconductor wafer partitioned into a plurality of chip regions in which individual semiconductor integrated circuits are formed, said semiconductor wafer having a plurality of first electrodes formed over a main surface thereof and electrically connected to said semiconductor integrated circuits;
   (b) preparing a first card comprising: a first wiring board which has first wires formed therein; a first sheet which has a plurality of contact terminals formed over a second main surface for contact with said first electrodes, has a plurality of second wires formed therein and electrically connected to said contact terminals and to said first wires, has a second sheet having substantially the same linear expansion coefficient as said semiconductor wafer and bonded to a second back surface opposite to said second main surface formed with said contact terminals, and has an elastic member disposed to fill in an opening provided in said second sheet, said first sheet being held by said first wiring board such that said contact terminals have respective tips thereof opposing said main surface of said semiconductor wafer; and a pressing mechanism which has a first main surface opposing said first sheet and has a first back surface opposite to said first main surface, said pressing mechanism pressing, from a back surface side thereof, a first region of said first sheet which is formed with said contact terminals; and
   (c) performing electrical testing of said semiconductor integrated circuits by contacting said tips of said contact terminals with said first electrodes,
   wherein said elastic member is disposed at a position which prevents deformation of said first sheet resulting from a temperature change.

24. A manufacturing method according to claim 23, wherein said elastic member is disposed in said first region.

25. A manufacturing method according to claim 24, wherein said elastic member is disposed at a center of said first region.

26. A manufacturing method according to claim 24,
   wherein said first region has a rectangular plan configuration, and
   wherein a plurality of said elastic members are disposed at individual corner portions of said first region.

* * * * *